(12) United States Patent
Oh et al.

(10) Patent No.: US 8,399,973 B2
(45) Date of Patent: Mar. 19, 2013

(54) DATA STORAGE AND STACKABLE CONFIGURATIONS

(75) Inventors: HakJune Oh, Ottawa (CA); Jin-Ki Kim, Kanata (CA); Hong Beom Pyeon, Kanata (CA)

(73) Assignee: Mosaid Technologies Incorporated, Ottawa, ON (*) Notice: Subject to any disclaimer, the term of this patent is extended or adjusted under 35 U.S.C. 154(b) by 1249 days.

(21) Appl. No.: 12/168,354

(22) Filed: Jul. 7, 2008

(65) Prior Publication Data

US 2009/0161402 A1 Jun. 25, 2009

Related U.S. Application Data

(60) Provisional application No. 61/032,203, filed on Feb. 28, 2008, provisional application No. 61/015,345, filed on Dec. 20, 2007.

(51) Int. Cl.
*H01L 23/02* (2006.01)
*H01L 23/48* (2006.01)

(52) U.S. Cl. ............... 257/686; 257/777; 257/E25.006; 257/E31.111

(58) Field of Classification Search ............ 257/686, 257/777, E25.006, E25.013, E25.018, E25.021, 257/E25.027, E23.085, E21.614, E31.111
See application file for complete search history.

(56) References Cited

U.S. PATENT DOCUMENTS

| | | | |
|---|---|---|---|
| 5,191,405 A | 3/1993 | Tomita et al. | |
| 5,323,060 A | 6/1994 | Fogal et al. | |
| 5,373,189 A | 12/1994 | Massit et al. | |
| 5,399,898 A | 3/1995 | Rostoker | |
| 5,473,196 A | 12/1995 | De Givry | |
| 5,477,082 A | 12/1995 | Buckley, III et al. | |
| 5,502,289 A | 3/1996 | Takiar et al. | |
| 5,579,207 A | 11/1996 | Hayden et al. | |
| 5,646,067 A | 7/1997 | Gaul | |
| 5,721,452 A * | 2/1998 | Fogal et al. | 257/685 |
| 5,777,345 A | 7/1998 | Loder et al. | |
| 5,778,419 A | 7/1998 | Hansen et al. | |
| 5,998,864 A | 12/1999 | Khandros et al. | |
| 6,002,177 A | 12/1999 | Gaynes et al. | |
| 6,087,722 A | 7/2000 | Lee et al. | |
| 6,133,637 A | 10/2000 | Hikita et al. | |
| 6,187,652 B1 | 2/2001 | Chou et al. | |
| 6,215,182 B1 | 4/2001 | Ozawa et al. | |
| 6,291,884 B1 | 9/2001 | Glenn et al. | |
| 6,353,265 B1 | 3/2002 | Michii | |

(Continued)

FOREIGN PATENT DOCUMENTS

CA 2196024 8/1997
JP 60034054 A * 2/1985

OTHER PUBLICATIONS

International Search Report, Mar. 5, 2009, pp. 2.

(Continued)

*Primary Examiner* — Teresa M Arroyo
(74) *Attorney, Agent, or Firm* — Chapin IP Law, LLC

(57) ABSTRACT

A first memory device and second memory device have a same input/output layout configuration. To form a stack, the second memory device is secured to the first memory device. To facilitate connectivity, the second memory device is rotationally offset with respect to the first memory device in the stack to align outputs of the first memory device with corresponding inputs of the second memory device. The rotational offset of the second memory device with respect to the first memory device aligns one or more outputs of the first memory device with one or more respective inputs of the second memory device. Based on links between outputs and inputs from one memory device to another in the stack, the stack of memory devices can include paths facilitating one or more series connection configurations through he memory devices.

30 Claims, 30 Drawing Sheets

U.S. PATENT DOCUMENTS

| | | |
|---|---|---|
| 6,376,904 B1 | 4/2002 | Haba et al. |
| 6,388,320 B2 | 5/2002 | Smola et al. |
| 6,410,431 B2 | 6/2002 | Bertin et al. |
| 6,426,560 B1 * | 7/2002 | Kawamura et al. ........... 257/777 |
| 6,429,096 B1 | 8/2002 | Yanagida |
| 6,448,661 B1 | 9/2002 | Kim et al. |
| 6,555,917 B1 | 4/2003 | Heo |
| 6,563,205 B1 * | 5/2003 | Fogal et al. ................... 257/686 |
| 6,566,746 B2 | 5/2003 | Isaak et al. |
| 6,577,013 B1 | 6/2003 | Glenn et al. |
| 6,621,169 B2 | 9/2003 | Kikuma et al. |
| 6,650,008 B2 | 11/2003 | Tsai et al. |
| 6,678,167 B1 | 1/2004 | Degani et al. |
| 6,713,855 B2 * | 3/2004 | Callahan ....................... 257/686 |
| 6,784,019 B2 * | 8/2004 | Huang ........................... 438/106 |
| 6,841,883 B1 | 1/2005 | Farnworth et al. |
| 6,849,802 B2 | 2/2005 | Song et al. |
| 6,861,761 B2 | 3/2005 | Yang et al. |
| 6,879,036 B2 * | 4/2005 | Nakai ........................... 257/723 |
| 6,900,528 B2 | 5/2005 | Mess et al. |
| 6,908,785 B2 | 6/2005 | Kim |
| 6,921,968 B2 | 7/2005 | Chung |
| 6,958,532 B1 | 10/2005 | Nakayama |
| 6,982,487 B2 | 1/2006 | Kim et al. |
| 7,023,076 B2 | 4/2006 | Khiang |
| 7,071,547 B2 * | 7/2006 | Kang et al. .................... 257/686 |
| 7,101,733 B2 | 9/2006 | Huang |
| 7,102,905 B2 | 9/2006 | Funaba et al. |
| 7,115,972 B2 | 10/2006 | Dotta et al. |
| 7,125,745 B2 | 10/2006 | Chen et al. |
| 7,132,752 B2 | 11/2006 | Saeki |
| 7,132,754 B1 | 11/2006 | Schmidt |
| 7,163,842 B2 | 1/2007 | Karnezos |
| 7,170,157 B2 | 1/2007 | Lee |
| 7,173,340 B2 | 2/2007 | Zhou et al. |
| 7,193,310 B2 | 3/2007 | Roeters et al. |
| 7,199,458 B2 | 4/2007 | Lee |
| 7,208,758 B2 | 4/2007 | Lunde et al. |
| 7,215,033 B2 | 5/2007 | Lee et al. |
| 7,217,995 B2 | 5/2007 | Tsai et al. |
| 7,218,003 B2 | 5/2007 | Storli |
| 7,221,613 B2 | 5/2007 | Pelley et al. |
| 7,241,641 B2 | 7/2007 | Savastiouk et al. |
| 7,242,635 B2 | 7/2007 | Okuda |
| 7,262,506 B2 | 8/2007 | Mess et al. |
| 7,268,418 B2 | 9/2007 | Wang |
| 7,271,026 B2 | 9/2007 | Gross |
| 7,276,799 B2 | 10/2007 | Lee et al. |
| 7,282,791 B2 | 10/2007 | Funaba et al. |
| 7,291,924 B2 | 11/2007 | Wang et al. |
| 7,298,032 B2 | 11/2007 | Kim et al. |
| 7,307,348 B2 | 12/2007 | Wood et al. |
| 7,309,923 B2 | 12/2007 | Kee |
| 7,315,078 B2 | 1/2008 | Huang |
| 7,317,256 B2 | 1/2008 | Williams et al. |
| 7,531,905 B2 | 5/2009 | Ishino et al. |
| 2001/0001292 A1 | 5/2001 | Bertin et al. |
| 2002/0158325 A1 | 10/2002 | Yano et al. |
| 2002/0180025 A1 | 12/2002 | Miyata et al. |
| 2003/0183917 A1 * | 10/2003 | Tsai et al. ..................... 257/686 |
| 2003/0209809 A1 | 11/2003 | Lasky et al. |
| 2003/0211679 A1 * | 11/2003 | Kim et al. ..................... 438/200 |
| 2004/0124520 A1 | 7/2004 | Rinne |
| 2004/0191954 A1 | 9/2004 | Ano |
| 2004/0229401 A1 | 11/2004 | Bolken et al. |
| 2004/0232559 A1 | 11/2004 | Adelmann |
| 2005/0184398 A1 * | 8/2005 | Zhou et al. .................... 257/777 |
| 2005/0248036 A1 | 11/2005 | Kelly et al. |
| 2006/0001176 A1 | 1/2006 | Fukaishi et al. |
| 2006/0076690 A1 * | 4/2006 | Khandros et al. ............. 257/777 |
| 2006/0091518 A1 * | 5/2006 | Grafe et al. ................... 257/686 |
| 2006/0097374 A1 | 5/2006 | Egawa |
| 2006/0197211 A1 | 9/2006 | Miyata et al. |
| 2006/0205111 A1 | 9/2006 | Gross |
| 2006/0226529 A1 | 10/2006 | Kato et al. |
| 2006/0286822 A1 | 12/2006 | Thomas et al. |
| 2007/0045827 A1 | 3/2007 | Han et al. |
| 2007/0076479 A1 | 4/2007 | Kim et al. |
| 2007/0096332 A1 * | 5/2007 | Satoh et al. ................... 257/777 |
| 2007/0109833 A1 | 5/2007 | Pyeon et al. |
| 2007/0158808 A1 | 7/2007 | Bruce et al. |
| 2007/0246257 A1 | 10/2007 | Muff et al. |
| 2007/0257340 A1 | 11/2007 | Briggs et al. |
| 2007/0296090 A1 | 12/2007 | Hembree |
| 2008/0122040 A1 | 5/2008 | Brogan et al. |
| 2009/0283872 A1 | 11/2009 | Lin et al. |

OTHER PUBLICATIONS

Jenny Kim, "MCP: Answer to Processing Barrier", Nikkei Electronics Asia, Nov. 2007, pp. 1-3, Seoul Korea.

Photograph: Hynix's 24-Die MCP, from Nikkei Electronics Asia Report, Nov. 2007, p. 1.

Photograph: Samsung M358T5168AZO-CE80Q, Photograph downloaded from Internet before Feb. 19, 2008, uncertain of exact date of reference.

Karnezos M., 3D Packaging Tutorial, 12th Annual KGD Packaging & Test Workshop, Sep. 11-14, 2005, Napa, CA, USA.

IEEE Standard for High-Bandwidth Memory Interface Based on Scalable Coherent Interface (SCI) Signaling Technology (RamLink), Microprocessor and Microcomputer Standards Committee of the IEEE Computer Society, IEE Std 1596.4-1996 ,The Institute of Electrical and Electronics Engineers, Inc., New York, NY 10017, USA, ISBN 1-55937-745-3.

Siblerud P. & Kim B., Cost Effective TSV Chip Integration, EMC-3D Semiconductor 3-D Equipment and Materials Consortium, EMC-3D SE Asia Technical Symposium, Jan. 22-26, 2007.

Photograph: Hynix's 24-Die MCP.

Photograph: Samsung M358T5168AZO-CE80Q.

* cited by examiner

EXAMPLE OF MULTI-AXIS OFFSETTING OF CHIPS IN A MEMORY STACK

DATA STORAGE AND STACKABLE CONFIGURATIONS

RELATED APPLICATIONS

This application is related to and claims priority to earlier filed U.S. Provisional Patent Application Ser. No. 61/032,203 entitled "PACKAGING METHOD FOR SERIALLY INTERCONNECTED MEMORY CHIPS," filed on Feb. 28, 2008, the entire teachings of which are incorporated herein by this reference.

This application is related to and claims priority to earlier filed U.S. Provisional Patent Application Ser. No. 61/015,345 entitled "Method For Stacking Serially-Connected Integrated Circuits And Multi-Chip Device Made From Same," filed on Dec. 20, 2007, the entire teachings of which are incorporated herein by this reference.

This application is related to earlier filed U.S. patent application Ser. No. 11/324,023 entitled "Multiple Independent Serial Link Memory," filed on Dec. 30, 2005, the entire teachings of which are incorporated herein by this reference.

This application is related to earlier filed U.S. Continuation-in-Part patent application Ser. No. 11/594,564 entitled "Daisy Chain Cascading Devices," filed on Nov. 8, 2006, the entire teachings of which are incorporated herein by this reference.

This application is related to earlier filed U.S. Provisional Patent Application Ser. No. 61/013,036 entitled "Memory System With Point-To-Point Ring Topology," filed on Dec. 12, 2007, the entire teachings of which are incorporated herein by this reference.

BACKGROUND

Conventional wire bonding (WB) is a method of making interconnections with a semiconductor chip. A bonding wire is generally made from one of the following materials: gold, aluminum or copper. Wire diameters typically start at around 15 μm and can be up to several hundred micro-meters for high-powered applications.

There are two main classes of wire bonding: Ball bonding and Wedge bonding.

Ball bonding is usually restricted to use of gold and copper wire, and usually requires heat to make a respective bond. Wedge bonding can use either gold or aluminum wire. When gold is used in wedge bonding, heat is required to make a respective bond.

In either type of wire bonding, the wire is typically attached using some combination of heat, pressure, and ultrasonic energy to make a weld. Wire bonding is generally considered the most cost-effective and flexible interconnect technology. Wire bonding is thus widely used to assemble the vast majority of semiconductor packages.

Conventional memory chips in a so-called "Multi-Chip-Package (MCP)" system are often interconnected using a parallel interconnection scheme. This "multi-drop" connection method includes interconnecting the memory chips in a manner such that address and data information and control signals are coupled to the chips in a parallel manner using common signal buses. For example, each memory chip can include multiple inputs and outputs to accommodate a parallel transfer of control information, address information, and data through an interconnected set of memory devices.

Various three-dimensional Package-on-Packages (PoPs) have recently been developed in the semiconductor memory industry in efforts to, for example, satisfy demand for increased memory density and functionality. In accordance with some example developments, a conventional three-dimensional package-on-package may be fabricated as follows: After manufacturing a wafer and separating the wafer into a plurality of individual chips, a corresponding chip can be attached and electrically connected to a substrate. The chip can be encapsulated with a molding resin to produce a package. A so-called package-on-package can be created by stacking the packages. These package-on-packages employ a lead frame, or a substrate such as, for example, a tape circuit board or a printed circuit board. An interconnect method such as, for example, a Wire-Bonding (WB), Tape-Automated-Bonding (TAB), or flip-chip-bonding, can be employed to establish electrical connections between the chip and the substrate.

Unfortunately, the different known methods of fabricating PoPs requires use of complex fabrication processes. Moreover, these PoPs are quite large compared to a standard chip, thereby reducing the mounting density on the external apparatus. Further, PoPs can include many interconnected chips with long signal transmission routes. Long routes may, for example, cause signal delays which could be expected to lower system performance.

However, stackings of memory chips into three-dimensional stacked-chip Multi-Chip-Packages (MCPs) on wafer-level or chip-level have the advantage of simple structures, smaller sizes, and simple manufacturing processes. Further, a multi-chip-package at the wafer-level may prevent signal delay.

It is possible to classify multi-chip-packages into two types. One is a multi-chip-package formed by stacking different types of chips, thereby achieving multi-functionality. The other is a multi-chip-package formed by stacking the same types of chips, thereby expanding the memory capacity.

NAND Flash memory is a commonly used type of non-volatile memory in widespread use as mass storage for consumer electronics, such as digital cameras and portable digital music players for example.

The density of a presently available NAND Flash memory chip can be up to 32 Gbits (i.e. 4 GBytes), which is suitable for use in popular USB Flash drives since the size of one chip is small. However, recent demand for consumer electronics devices with music and video capabilities has spurred demand for ultra-high capacities to store the large amounts of data, which cannot be met by the single NAND Flash memory chip. Therefore, multiple NAND Flash memory chips have been interconnected with each other into a storage system to effectively increase the available storage capacity. In certain cases, Flash storage densities of 250 GB or more may be required to accommodate data storage needs.

BRIEF DESCRIPTION OF THE DRAWINGS

Reference will now be made, by way of example, to the accompanying drawings of which.

DETAILED DESCRIPTION OF ILLUSTRATED EMBODIMENTS

Figure 1:
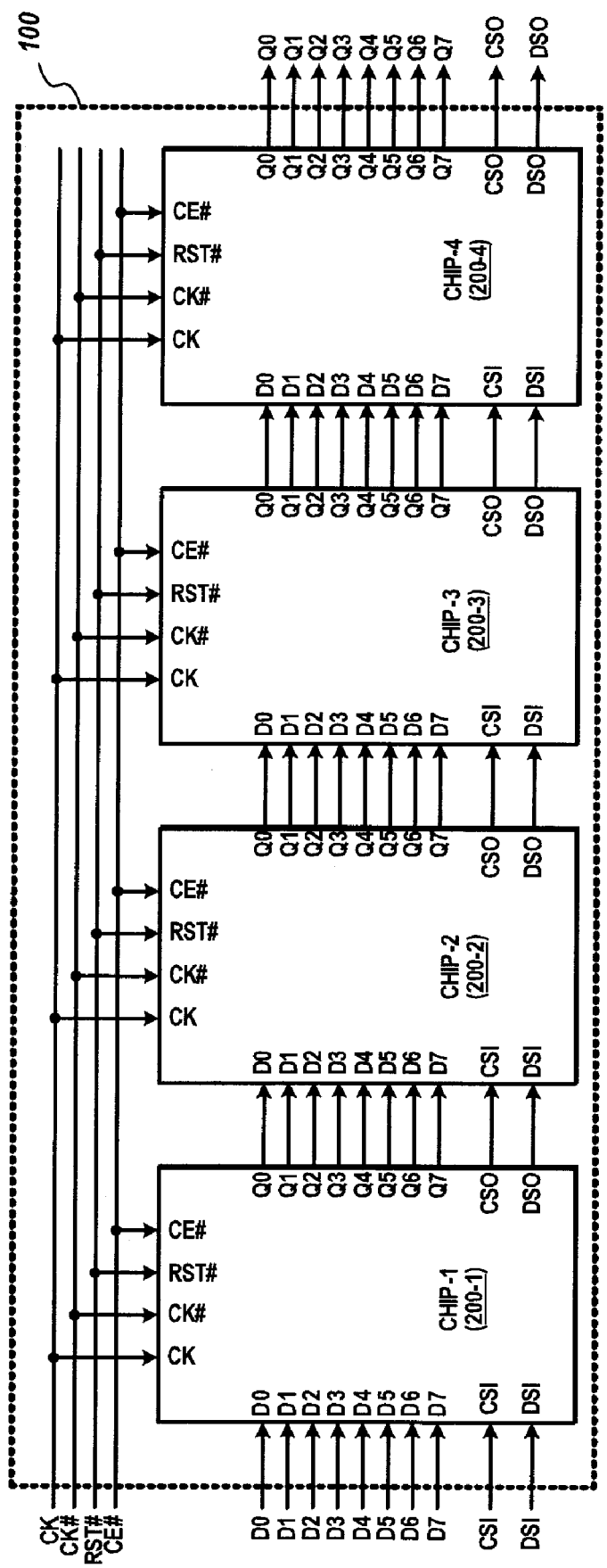
FIG. 1 is an example diagram of a memory system according to embodiments herein.

There are drawbacks associated with conventional methods of stacking semiconductor chips to accommodate storage of data. For example, even though a 3-D chip-stacked MCP can employ a number of NAND Flash memories to form a memory storage system, the respective storage system may not provide required performance as a result of the large number of required interconnections between memory devices. Thus, fabrication of a high performance 3-dimensional stack of memory devices can be challenging.

There are further drawbacks associated with stacking semiconductor chips. Attaching a stack of devices to a corresponding printed circuit board (PCB) or substrate can be difficult. Additionally, because there are so many interconnections between memory devices in a stack, undesirable effects such as, for example, crosstalk can limit the performance of these types of storage subsystems.

One specific factor limiting performance of a memory storage system is propagation delays. Propagation delays caused by heavily loaded and long interconnections can limit the number of chips that can be incorporated in a memory storage system.

In general, embodiments herein include improvements over conventional methods, systems, etc.

For example, according to embodiments herein, a memory storage system includes a stacking of a first memory device and a second memory device. The first memory device and second memory device have a same input/output layout configuration. To form the stack, the second memory device is secured to the first memory device. To facilitate connectivity between outputs of the first memory device and inputs of the second memory device, the second memory device is rotationally offset with respect to the first memory device in the stack to align outputs of the first memory device with corresponding inputs of the second memory device. The rotational offset of the second memory device with respect to the first memory device in the stack results in substantial alignment of one or more outputs of the first memory device with one or more respective inputs of the second memory device. The stack of memory devices can include paths facilitating one or more series connection configurations between the first memory device and the second memory device.

Such an embodiment is useful over conventional methods because rotationally offsetting memory devices (for example, around 180 degrees) to align inputs and outputs enables creation of a memory storage stack based on memory devices having a common input/output layout configuration. The common configuration alleviates a need to stock memory devices having different input/output configuration layouts to create a stack.

Note that a controller can be coupled to the stack in a number of ways. For example, the controller and stack can be attached to a substrate such as, for example, a printed circuit board. Conductive paths in the substrate can provide connectivity between the controller and the stack of memory devices.

In accordance with another embodiment, the stack can include the controller. In such an embodiment, the controller can be secured to a memory device in the stack such as the first or last memory device in the stack (for example, memory device at either ends of the stack).

Note that the stack can generally include any reasonable number of memory devices. For example, in one embodiment, the stack includes a third memory device secured to the second memory device. The third memory device has the same input/output layout configuration as the first memory device and the second memory device. To align outputs of the second memory device with corresponding inputs to the third memory device, the third memory device in the stack is rotationally offset with respect to the second memory device in the stack.

Accordingly, embodiments herein include rotationally offsetting each successive memory device in the stack to increase expand a length of a series connection configuration through the stack. In the above example, addition of the third memory and/or subsequent memory devices to the stack extends the one or more paths through the first memory device, the second memory device, and the third memory device for conveyance of the data.

The memory devices (such as the first memory device, second memory device, third memory device, etc.) in the stack can be planar-shaped and have a respective top facing and bottom facing. That is, the memory devices can be semiconductor chips cut from one or more wafers. The memory devices can be stacked on top of each other in which a respective bottom facing of a memory device in the stack is secured to a top facing of another memory device in the stack such that the top facing of the first memory device and the top facing of the second memory device point in a same direction along the stack. Each of multiple memory devices in the stack can face the same direction along the stack. Thus, fabrication need not include a complex flipping process to flip the chips with respect to each other.

The input/output layout configuration of memory devices used in the stack can include input contacts and output contacts. As mentioned, the layout configuration for each of the memory devices can be the same. When created, the stack can include one or more serial configuration connections or paths based on connections (for example, wire bonds, through-hole connections, etc.) between the input/output contacts. For example, the one or more paths can be created based on conductive links between output contacts from one memory device in the stack to corresponding input contacts of a successive memory device in the stack.

In one embodiment, the one or more paths in the stack support conveyance of data through the stack. A controller can be electrically coupled to the one or more paths in the stack for accessing data stored in the stack.

In a more specific one embodiment, the controller is coupled to a memory device in the stack. The controller can be configured to access data from the memory device based on a flow of data along the path through one or more memory devices in the stack. For example, the controller can access data from the first memory device based on a passage of data along one or more paths through at least the second memory device back to the controller. In one embodiment, a connection between a last memory device in the stack back to the controller enables the controller to receive data from the memory devices in the stack based on a flow of data along the one or more paths.

A coupling between the controller and, for example, the first memory device of the stack enables the controller to convey data through the memory devices and thus store data in the memory devices. The coupling between the last memory device in the stack back to the controller enables the controller to retrieve data stored in the respective memory devices.

Each memory device in the stack can be set to a passthrough mode or a memory access mode. In one embodiment, the pass-through mode enables a respective memory device in the stack to convey data received at an input of the respective memory device along a circuit path to an output of the respective memory device. Thus, in example embodiments, the controller can cause data to pass through a first memory device in the stack for storage in a target memory device in the stack.

In one embodiment, the memory access mode associated with a memory devices enables i) reception of data on a path and storage of the data to memory circuitry associated with a respective memory device in the stack, and ii) retrieval of data from the memory circuitry in the respective memory device for transmission on the path to an output of the respective memory device back to the controller. Thus, the controller can cause data to be stored or retrieved from a retrieved from a particular memory device in the stack.

Each of the one or more paths through the stack can include segments through the memory devices. For example, a path through the stack can include a first path segment and a second path segment. The first path segment includes a circuit path between an input and output of the first memory device. The second path segment includes a circuit path between an input and output of the second memory device. Based on the rotational offset of the second memory device with respect to the first memory device in the stacking, an axis between the input and output of the first memory device in the stack can be parallel to an axis between the input and output of a second memory device (for example, successive) memory device in the stack.

In furtherance of such embodiments, a direction of data flow from the input to the output of the first memory device can be substantially opposite to a direction of data flow from the input to the output of the second memory device. For example, the first path segment of a given path (for example, a portion of the path in the first memory device) through the stack can diagonally traverse a plane of the first memory device from an input near a first edge of the first memory device to an output near a second edge of the first memory device. The second path segment of the given path (for example, a portion of the path in the second memory device) through the stack can diagonally traverse a plane of the second memory device from an input near a first edge of the second memory device to an output near a second edge of the second memory device.

As previously discussed, stacking of memory devices can include rotationally offsetting each successive memory device in the stack. In further embodiments, note that the memory devices can be staggered or offset with respect to a stacking axis so that each chip in the stacks creates an overhang with respect to another chip in the stack. For example, the second memory device in the stack can be staggered or offset with respect to the first memory device in the stack to expose outputs on a plane of the first memory device for electrically connecting to inputs on a plane of the second memory device. The third memory device can be staggered or offset with respect to the second memory device in the stack to expose outputs on a plane of the second memory device for electrically connecting to inputs on a plane of the third memory device.

In general, the staggering of memory devices can be repeated throughout creation of the stack so that outputs of one memory device are exposed for connecting to inputs of a successive memory device.

Each successive pair of memory devices in the stack can be electrically connected with each other. For example, conductive links provide bridging of the outputs on the plane of the first memory device to the inputs on the plane of the second memory device. In one embodiment, inputs and outputs on each memory device are surface pads. Links can be wire bonds connecting an input surface pad of one memory device to an output surface pad of another memory device.

In accordance with another embodiment, note that as an alternative to staggering the successive memory devices in the stack for making connections, the memory devices can be aligned in the stack such that outputs located on a top facing of the first memory device are vertically aligned over corresponding inputs located on the top facing of the second memory device. In accordance with such an embodiment, the inputs of the input/output layout configuration associated with each memory device can be configured as through-hole connections. The outputs of the input/output layout configuration associated with each memory device can be configured as pads supporting surface connectivity.

The one or more paths through the stack can be created by linking outputs of a memory device in the stack to inputs of a successive memory device in the stack. Providing, for example, conductive material between a surface pad and corresponding through-hole connection can create a link connection between memory devices.

Other embodiments herein include a memory device such as, for example, a semiconductor chip. The semiconductor chip includes an input-output configuration including one or more inputs and one or more outputs. The semiconductor chip includes a respective input-output circuit path between pairings of each of the inputs and the outputs to convey data through the semiconductor chip.

The inputs of the semiconductor chip can be configured as through-hole connections or vias. As their name suggests, the through-hole connections pass from a top facing of the semiconductor chip through the semiconductor chip to a bottom facing of the semiconductor chip. The through-hole connections are also electrically connected to circuits in the respective semiconductor chip. The through-hole connections thus provide a way to connect internal circuitry of the semiconductor chip to other external circuitry.

The outputs of the semiconductor chip can be configured as surface contact pads disposed on a planar surface of the semiconductor chip. The surface pads connections are also electrically connected to corresponding circuits in the respective semiconductor chip. Thus, similar to the through-hole connections, the surface pads provide a way to connect internal circuitry of the semiconductor chip to other external circuitry.

Creation of a semiconductor chip including surface pad outputs and through-hole inputs is useful because a connection between one semiconductor chip and a next semiconductor chip of the same input/output configuration can be connected via a link between a respective surface pad and through-hole connection. That is, the through-hole connector of the semiconductor chip enables connectivity between the surface contact pad at the output of the semiconductor chip to a through-hole connector at an input of another semiconductor chip (which has the same configuration layout).

As previously discussed, a memory device such as, for example, a semiconductor chip can include multiple inputs and multiple outputs. Each of the multiple inputs can be configured as through-holes connectors or vias. Each of the multiple outputs can be configured as surface pads. Links includes conductive material between through-hole connectors and corresponding surface pads to create paths through the stack.

More specifically, another embodiment herein includes a stacking of the semiconductor chip as discussed above. For example, a memory storage system according to embodiments herein can include a first memory device and a second memory device having a same input/output layout configuration as the first memory device. The memory storage system can be configured as a stack. The stack includes the second memory device secured to the first memory device. The second memory device is oriented in the stack to align outputs of the first memory device with corresponding inputs to the second memory device. The stack further includes connectivity between the outputs of the first memory device and the inputs of the second memory device. For example, as mentioned above, the connectivity between memory devices can include connections between surface pads on a plane of the first memory device and through-holes of the second memory device. In such an embodiment, the surface pads are outputs of the first memory device and the through-holes are inputs to the second memory device.

To align the surface pads of the first memory device with corresponding through-holes of the second memory device, embodiments herein can include rotationally offsetting (by an amount such as, for example, around 180 degrees) one memory device relative to a successive memory device in the stack. The rotational offset can be performed with about a stacking axis such as, for example, the axis along which the memory devices are stacked on top of each other.

Connectivity between memory devices can include, by way of a non-limiting example, a first connection and a second connection. In one embodiment, the first connection links a first surface pad of the first memory device to a first though-hole of the second memory device. The second connection links a second surface pad of the first memory device to a second through-hole of the second memory device. The first connection can be part of one path segment through the stack while the second connection can be part of another path segment through the stack. That is, the first connection creates a first path by linking a first output of the first memory device to a first input of the second memory device, the second connection creating a second path by linking a second output of the first memory device to a second input of the second memory device. Of course, any suitable number of paths can be created in the stack via connections between memory devices.

In a similar vein as discussed above, the stack can include a number of additional memory devices having the most recently discussed layout configuration of surface pads and through-holes. For example, in one embodiment, the stack includes a third memory device secured to the second memory device. The third memory device has the same input/output layout configuration as the first memory device and the second memory device. In such an embodiment, the stack includes connectivity between outputs of the second memory device and inputs of the third memory device. The connectivity includes connections between surface pads or outputs on a plane of the second memory device and through-holes such as, for example, inputs of the third memory device. As previously discussed, the connectivity form one memory device to a next device in the stack forms respective paths through the memory devices.

In any of the embodiments, the one or more paths through the stack support conveyance of data through the stack. Certain of the paths can be used for control purposes. For example, one or more paths through the memory devices can be used to convey control signals or control data through and to the memory devices in the stack to enable a respective controller to control the memory devices.

The control signals for controlling operation of one or more respective memory devices in the stack can be generated by a controller or another memory device in the stack.

The memory storage system including the layout configuration of surface pads and through-holes can include a controller. For example, a controller can be electrically coupled to the stack for accessing data stored in the stack. In one embodiment, the controller is electrically coupled to a first memory device in the stack such as, for example, the first memory device. The controller can be configured to access data from the first memory device based on a flow of data along the path from the first memory device through at least the second memory device and/or or other memory devices in the stack back to the controller. A connection between a last memory device in the stack back to the controller enables the controller to receive data from the memory devices in the stack based on a flow of data along the one or more paths.

The coupling between the controller and the first memory device in the stack enables the controller to convey data through the memory devices and thus store data in the memory devices. The coupling between the last memory device in the stack back to the controller enables the controller to retrieve data stored in the respective memory devices. However, in this latter embodiment, connectivity includes through-hole to surface pad connections.

To enable passing of data back to the controller, note that embodiments herein also can include electrical connectivity such as, for example, wire bonds between surface pads (such as, for example, outputs) on a plane of the second memory device (or a last memory device in the stack) to inputs associated with the controller.

In a manner as previously discussed, each memory device in the stack can be set to a pass-through mode or a memory access mode.

In one embodiment, each of the memory devices in the stack are planar-shaped and have a respective top facing and bottom facing. A first memory device and a subsequent memory device are stacked on top of each other in which a respective bottom facing of the second memory device is secured to a top facing of the first memory device. The top facing of the first memory device and the top facing of the second memory device point in a same direction along the stack. Based on proper alignment of memory devices in the stack, outputs located on the top facing of the first memory device are vertically aligned over corresponding inputs located on the top facing of the second memory device. In other words, the memory devices can be aligned such that surface pads (outputs) of one memory device in the stack align directly with through-holes (inputs) to a subsequent memory device in the stack.

In yet further embodiments herein, a semiconductor chip includes a configuration layout including multiple inputs and multiple outputs for conveyance of data through the semiconductor chip. The semiconductor chip also includes input-output pairings in which inputs in the configuration layout are diagonally paired with the multiple outputs in the configuration layout. The semiconductor chip includes a respective input-output circuit path between each of the input-output pairings.

The circuit paths through the semiconductor chip can support different functions such as, for example, conveyance of data or control signals through the semiconductor chip and, thus, memory storage stack.

The configuration layout of the semiconductor chip can include an ordering of the multiple inputs and multiple outputs. Each of the respective circuit paths between the input-output pairings in the layout includes an input and a corresponding output. The corresponding output of an input-output pairing is diagonally across from the input in the layout of the semiconductor chip. In one embodiment, the corresponding output in the layout is offset 180 degrees apart from the with respect to the input in the layout.

In still further embodiments, a semiconductor chip includes a configuration layout including multiple inputs and multiple outputs for conveyance of data through the semiconductor chip. Input-output pairings of the layout are based on a pairing of each input with a corresponding one of the multiple outputs. A respective input-output circuit path between each of the input-output pairings is oriented to cross other respective input-output circuit paths in the semiconductor chip. In other words, according to one embodiment, an input/output layout configuration of the semiconductor chip can be chosen such that some or all of the axes associated with the input-output pairings cross each other.

The layout configuration layout of the semiconductor chip can include a column inputs and a column of outputs. The columns can be parallel each other and disposed along or in proximity to respective edges of the semiconductor chip. In furtherance of such an embodiment, the input-output pairings include circuit paths between an input in one column and an output in another column. In other embodiments, each of the columns includes both inputs and outputs.

As previously discussed, the semiconductor chip including input-output pairings can include memory to store data. Each of the respective input-output circuit paths enables access to a corresponding portion of the memory.

In an example embodiment, the configuration layout can include an ordering of the multiple inputs and the multiple outputs in proximity to a perimeter of the semiconductor chip. Each of the respective circuit paths between input-output pairs includes an input in proximity to the perimeter of the semiconductor chip as well as a corresponding output in proximity to the perimeter of the semiconductor chip. The corresponding output of a respective circuit path can reside at a position substantially 180 degrees offset from the input similar to the configuration of a traditional clock in which the number 4 is located opposite the number 10; the number 5 is located opposite the number 11, and so on. However, as mentioned above, the input/outputs of the semiconductor chip can form one or more columns rather than form a circle.

In yet further embodiments, memory storage stack includes a first memory device and a second memory device. Both the first memory device and the second memory device have a same input/output layout configuration. The first memory device is offset (to produce a step) with respect to the second memory device to expose outputs on a planar surface of the first memory device for electrically connecting to inputs on a planar surface of the second memory device. Each additional memory device added to the stack can be offset in the same direction to produce a staircase type of stacking.

Connectivity between the outputs from one memory device to inputs of another memory device creates paths. As mentioned above, the paths facilitate a series connection through the first memory device and the second memory device and support functionality such as, for example, conveyance of data. The data can be commands, information for storage in a respective memory device, information being retrieved from a respective memory device, etc.

The connectivity between one memory device and another memory device in the memory storage stack can include a conductive link. The conductive link can be a wire bond between an output of the first memory device and an input of the second memory device.

In one embodiment, the input/output layout configuration of each memory device in the memory storage stack includes a sequence of multiple inputs and multiple outputs along one or more edges of a respective memory device.

An input and corresponding output on a memory device can be located next to each other in the input/output layout configuration of the semiconductor chip as most recently discussed. The output of a given memory device can be electrically linked to an input on a next successive memory device in the memory storage stack to form a path to convey data through the stack. Locating an input and corresponding output of a memory device next to each other reduces a length of a conductive link required to connect an output of one memory device to a corresponding input of another memory device in the memory storage stack.

By way of a non-limiting example, the memory storage stack can include additional memory devices such as, for example, a third memory device having the same input/output layout configuration as the first memory device and the second memory device. In a similar manner that the second memory device is offset with respect to the first memory device, the third memory device can be offset with respect to the second memory device (in the same direction that the second memory device was offset with respect to the first memory device) in the stack to expose outputs of the second memory device for electrically connecting to inputs of the third memory device.

Addition of each memory device to the memory storage stack and corresponding linkage extends the series connection through each memory device in the stack such as first memory device, second memory device, third memory device, etc.

These and other embodiments will be discussed in more detail later in this specification with reference to corresponding figures.

As discussed above, techniques herein are well suited for use in stacking of memory devices and systems such as those supporting use of flash technology, electrically erasable semiconductor memory, non-volatile memory, etc. However, it should be noted that embodiments herein are not limited to use in such applications and that the techniques discussed herein are well suited for other applications as well.

Additionally, although each of the different features, techniques, configurations, etc., herein may be discussed in different places of this disclosure, it is generally intended that each of the concepts can be executed independently of each other or in combination with each other where feasible. Accordingly, at least some example embodiments of the invention can be embodied and viewed in many different ways.

Now, more particularly, FIG. 1 is an example diagram illustrating a memory system 100 according to embodiments herein.

As shown, the memory storage system 100 includes four serially connected memory chips 200 (for example, memory chip 200-1, memory chip 200-2, memory chip 200-3, and memory chip 200-4). Note that memory storage system 100 can include any suitable number of memory chips and that memory storage system 100 includes four memory chips by way of a non-limiting example only.

Each of the memory chips 200 comprises serial input ports (D0-7, CSI and DSI), serial output ports (Q0-7, CSO and DSO) and parallel common input ports (CK, CK#, RST# and CE#).

As shown in FIG. 1, via parallel connections, input signals (CK, CK#, RST# and CE#) are commonly coupled to respective input ports of all four memory chips 200-1, 200-2, 200-3 and 200-4. That is, signal CK drives respective input CK of each memory chip 200, signal CK# drives respective input CK# of each memory chip 200, and so on.

In one embodiment, signal CK represents a clock signal toggling between logic high and logic low states. Signal CK# toggles between logic high and low states as well and is 180 degrees out of phase with respect to the CK signal. For example, when the CK signal is a logic high, the CK# signal is a logic low. When the CK* signal is a logic low, the CK# signal is a logic high.

Note that signals along a left edge (e.g., signal CK, CK#, RST#, CE#, D0, D1, . . . , D7, CSI, DSI) of memory storage system 100 can be inputs from a source such as, for example, a memory controller. Signals along a right edge (e.g., signal Q0, Q1, Q2, . . . , Q7, CSO, DSO) of memory storage system 100 can be outputs back to the memory controller or can be outputs connected to the inputs of another successive memory storage system 100. In certain embodiments, note that a larger storage system can include multiple storage systems in which one or more multiple controllers enables access to data stored in respective memory chips.

Each chip can include appropriate power, ground, and other connectivity for proper operation.

The chips 200 of memory storage system 100 can be connected in series. For example, external serial input signals (shown as signals D0-D7, CSI, and DSI to the left of memory chip 200-1) for the memory storage system 100 are coupled to the serial input ports (D0-D7, CSI and DSI) of the first memory chip 200-1 as shown. Also, the serial output ports (Q0-Q7, CSO and DSO) of the first memory chip 200-1 are coupled with the serial input ports (D0-D7, CSI and DSI) of the second memory chip 200-2. Similarly, the serial output ports (Q0-Q7, CSO and DSO) of the second memory chip 200-2 are coupled with the serial input ports (D0-D7, CSI and DSI) of the third memory chip 200-3. Also, the serial output ports (Q0-Q7, CSO and DSO) of the third memory chip 200-3 are coupled with the serial input ports (D0-D7, CSI and DSI) of the fourth memory chip 200-4. Finally, the serial output ports (Q0-Q7, CSO and DSO) of the fourth memory chip 200-4 are coupled with the serial output signals (Q0-7, CSO and DSO) of the memory storage system 100.

More details of the memory chips 200 and the interconnections between the memory chips 200 (and other components of an associated system) are provided in a number of the previously referred to, commonly owned, patent applications as indicated above; however, it will understood that, in at least some examples, the memory chips 200 may be any suitable type of semiconductor chips. By way of a non-limiting example the memory chips 200 can be NAND Flash memory, NOR Flash memory, EEPROM, MRAM, PCM, ReRAM, FeRAM, SRAM, PSRAM and DRAM, etc.

Note that use of non-memory chips or integrated circuits is also contemplated in accordance with at least some embodiments herein. For example, the principles as described herein can be extended to provide connectivity with respect to non-memory type of circuits as well as the memory-based circuits shown in FIG. 1.

As mentioned above, note again that although four memory chips 200 are shown in the illustrated example, the number of chips inside the memory storage system 100 can be any number that is greater than one, and in some additional examples there may be one or more memory controller chips functioning as the host, which can provide for a SiP (System-in-Package) configuration.

Figure 2:
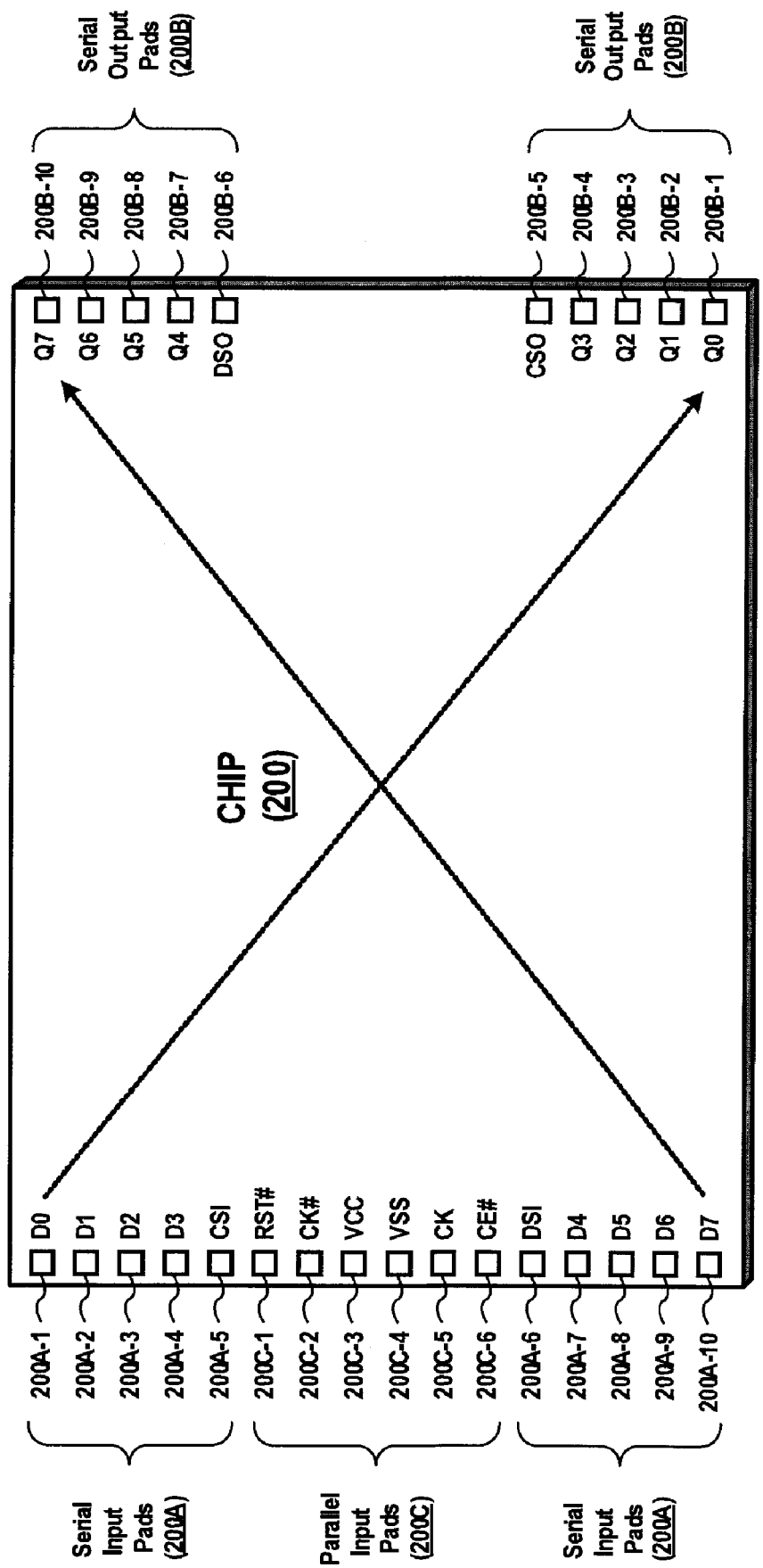
FIG. 2 is an example diagram of a stackable memory device and corresponding input/output layout configuration according to embodiments herein.

FIG. 2 is a 3-dimensional example diagram of a configuration layout of inputs and outputs in proximity to edges of a respective chip 200 according to embodiments herein. The example chip 200 as shown in FIG. 2 can include the appropriate functionality associated with each of the four memory chips 200 in FIG. 1. Pads shown on memory chip 200, which may be a semiconductor chip, are surface pads representing respective inputs/outputs as labeled. The pads electrically connect internally to memory circuitry, control circuitry, buffering circuitry, etc., associated with the chip 200. As discussed in this specification, the pads also provide connectivity to external circuitry. Accordingly, the pads of the chip 200 provide a way to connect internal circuitry of chip 200 to other external circuitry.

By way of a non-limiting example, the configuration layout of the semiconductor chip 200 can include a column including inputs and a column including outputs. The columns can be parallel each other and disposed along or in proximity to respective edges of the semiconductor chip.

In other embodiments, the chip includes columns of input/outputs on any or all edges of the chip 200.

Each input in one column is paired with a corresponding output in the opposite column. For example, input D0 is paired with output Q0 of chip 200; input D1 is paired with output Q1 of chip 200; input D2 is paired with output Q2 of chip 200; input D3 is paired with output Q3 of chip 200; input D4 is paired with output Q4 of chip 200; input CSI is paired with output CSO of chip 200; input DSI is paired with output DSO of chip 200; input D4 is paired with output Q4 of chip 200; input D5 is paired with output Q5 of chip 200; input D6 is paired with output Q6 of chip 200; input D7 is paired with output Q7 of chip 200.

In furtherance of such an embodiment, the input-output pairings can include circuit paths in the chip 200 between the pairings of inputs and outputs. Note again that the illustrations in FIG. 2 showing inputs in one column and outputs in another column of chip 200 is by way of example only and that each column can include both inputs and outputs.

The semiconductor chip 200 includes memory to store data. Each of the respective input-output circuit paths enables access to a corresponding portion of the memory.

On the left side of the chip 200, serial input pads or surface pads in group 200A (including 200A-1, 200A-2, 200A-3, ... , 200A-10) and parallel input pads in group 200C (200C-1, 200C-2, 200C-3, ... 200C-6) are located in the left column of the configuration layout as shown.

Data input pads, D0 to D3 and D4 to D7 are respectively located at proximate ends of the column of pads on the left side in accordance with a selected initial ordering D0, D1, D2, etc. along the edge of the chips 200, while the command strobe input (CSI) pad and the data strobe input (DSI) are located in the middle of the left column between the D3 and D4 pads.

The parallel input pads (200C-1, 200C-2, 200C-3, ... 200C-6) enable inputting of miscellaneous signals (CK, CK#, RST# and CE#) input into the chip 200.

On the right side of the memory chip 200, serial output pads 200B (200B-1, 200B-2, 200B-3, ... , 200B-10) are arranged in reverse or opposite order with respect to the initial ordering associated with inputs D0 through D7 (i.e., the order of the serial input pads in the left side of the chip). For example, input D0 resides in a top of the left column of chip 200 while corresponding output Q0 resides at a bottom of the right column of chip 200; input D0 is therefore across from output Q0 on the configuration layout of chip 200. Input D1 resides in a second position of the left column of chip 200 while corresponding output Q1 resides at a second to last position in the right column of chip 200; input D1 is therefore across from output Q1 on the configuration layout of chip 200. In a similar manner, each of the pairings is across from each other in the configuration layout of chip 200.

Each of the axis between pairs of inputs and corresponding outputs can cross each other in the configuration layout of chip 200. For example, the axis between input D0 and output Q0 crosses each of axes D1-Q1, D2-Q2, D3-Q3, CSI-CSO, DSI-DSO, D4-Q4, D5-Q5, D6-Q6, D7-Q7; the axis between input D1 and output Q1 crosses each of axes D0-Q0, D2-Q2, D3-Q3, CSI-CSO, DSI-DSO, D4-Q4, D5-Q5, D6-Q6, D7-Q7; the axis between input D2 and output Q2 crosses each of axes D0-Q0, D1-Q1, D3-Q3, CSI-CSO, DSI-DSO, D4-Q4, D5-Q5, D6-Q6, D7-Q7; the axis between input D3 and output Q3 crosses each of axes D0-Q0, D1-Q1, D2-Q2, CSI-CSO, DSI-DSO, D4-Q4, D4-Q4, D5-Q5, D6-Q6, D7-Q7; the axis between input CSI and output CSO crosses each of axes D0-Q0, D1-Q1, D2-Q2, D3-D3, DSI-DSO, D4-Q4, D4-Q4, D5-Q5, D6-Q6, D7-Q7, and so on.

Thus, according to embodiments herein, chip 200 can include a configuration input/output layout in which a respective input-output circuit path between each of the input-output pairings is oriented to cross other respective input-output circuit paths in the (semiconductor) chip 200.

Chip 200 includes corresponding circuitry such as a circuit path, corresponding memory, control logic, etc., between each pairing. For example, chip 200 includes a respective circuit path between input-output pair D0 and Q0; chip 200 includes a respective circuit path between input-output pair D1 and Q1; chip 200 includes a circuit path between input-output pair D2 and Q2; chip 200 includes a circuit path between input-output pair D3 and Q3, and so on.

The layout of input-output pairs has been chosen such that rotation of chip 200 with respect to another chip (having the same input/output configuration layout) causes alignment of outputs of one memory chip to inputs of another memory chip.

For the illustrated example bond pad arrangement (for example, input/output layout configuration), as mentioned above, data output pad Q0 (200B-1) of the first chip 200-1 in FIG. 1 is paired with the data input pad D0 (200A-1) of the second chip 200-2 of FIG. 1. Similarly, all other data input and output pads (D1-7 and Q1-7), CSI and CSO pads and DSI and DSO pads for each chips are serially interconnected with the appropriate order as indicated in FIG. 1 when creating a respective stack and more particularly shown in subsequent figures.

In order to achieve the above serial interconnectivity between the corresponding outputs of one memory device to a successive memory device as discussed above, the serial output pads of the chip can be located on the right side of the chip with reverse ordered positions against the left side's input pads locations as discussed above. For example, the Q0 pad is located on the bottom right corner of the chip, and the Q7 pad is located on the top right corner of the chip, as shown in example FIG. 2.

As illustrated in subsequent figures, the reversed and mirrored pad arrangement in respective input/output columns of chip 200 as shown in FIG. 2 can provide simpler, shorter and effective wire bonding solutions when multiple chips are vertically stacked and are serially interconnected. However, note that the number of data input and output pads is not limited so that x1 I/O or x2, x4, x16 I/O modes can be implemented in accordance with example embodiments.

Also, it will be understood that embodiments are not limited by the ordering of the input pads and the output pads.

Furthermore, it will be understood that the parallel input pads can be duplicated on the right side of the chip in order to provide more robust signaling. Additionally, typically needed power supply pads and other miscellaneous pads have not been shown, so as not to obscure the subject matter of the example embodiments as described herein.

In accordance with embodiments as discussed above, the (semiconductor) chip 200 includes a configuration layout including multiple inputs and multiple outputs for conveyance of data through the semiconductor chip. In one embodiment, the semiconductor chip 200 also includes input-output pairings in which inputs in the configuration layout are diagonally paired with the multiple outputs in the configuration layout. The chip 200 includes a respective input-output circuit path between each of the input-output pairings. The circuit paths through the semiconductor chip can support different functions such as, for example, conveyance of data or control signals through the semiconductor chip.

The configuration layout of the semiconductor chip can include an ordering of the multiple inputs and multiple outputs. Each of the respective circuit paths between the input-output pairings in the layout includes an input and a corresponding output. The corresponding output is diagonally across from the input in the layout.

In one embodiment, the corresponding output in the layout is offset 180 degrees apart from or with respect to the input in the layout. For example, output Q0 of chip 200 is diagonally located at a position 180 degrees offset from input D0; output Q1 of chip 200 is diagonally located at a position 180 degrees offset from input D1; output Q2 of chip 200 is diagonally located at a position 180 degrees offset from input D2; output Q3 of chip 200 is diagonally located at a position 180 degrees offset from input D3; output CSO of chip 200 is diagonally located at a position 180 degrees offset from input CSI; . . . ; output DSO of chip 200 is diagonally located at a position 180 degrees offset from input DSI; output Q4 of chip 200 is diagonally located at a position 180 degrees offset from input D4; output Q5 of chip 200 is diagonally located at a position 180 degrees offset from input D5; output Q6 of chip 200 is diagonally located at a position 180 degrees offset from input D6; output Q7 of chip 200 is diagonally located at a position 180 degrees offset from input D7.

Figure 3:
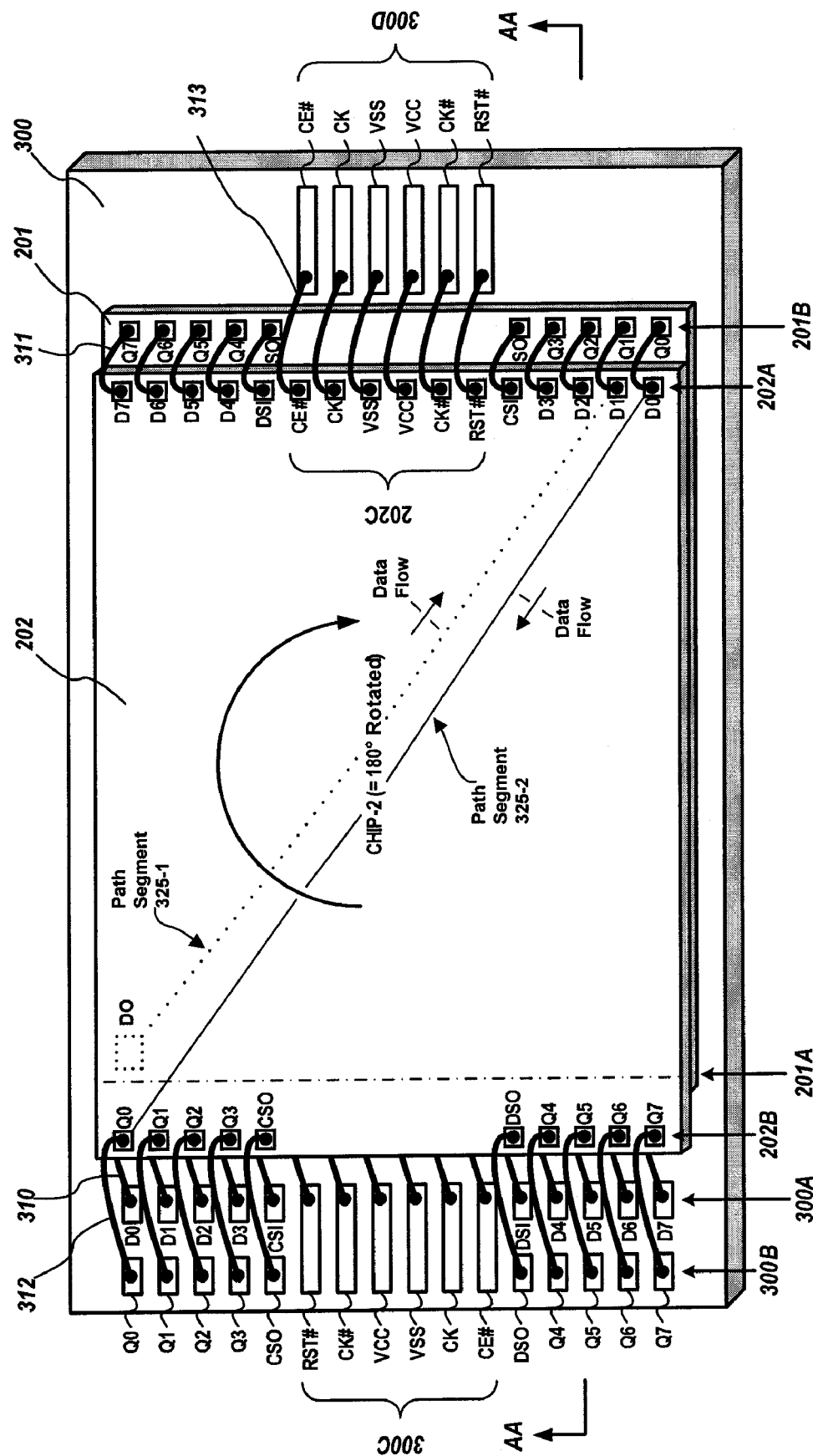
FIG. 3 is an example 3-dimensional diagram of a stacked memory system according to embodiments herein.

FIG. 3 is an example diagram illustrating multiple chips forming a respective memory storage stack according to embodiments herein.

The upper chip 202 is positioned on top of the bottom chip 201. The upper chip 202 is rotated 180 degrees with respect to the bottom chip 201 so that the outputs on chip 201 are exposed for connecting to the inputs of chip 202. Chip 202 is offset with respect to chip 201 in the stack so as to expose the pads of chip 201. The offset permits the serial input pads 202A of the upper chip 202 to be positioned close to the serial output pads 201B of the bottom chip 201.

By way of a non-limiting example, the 180° rotation and offset positioning of the second chip 202 permits the output pads of the first chip 201 to be revealed and allows for an easier wire bonding process in between the two corresponding serial input and output interconnections, such as Q0 to D0, Q1 to D1, Q2 to Q3, etc.

Continuing with the example embodiment in FIG. 3, link 311 such as, for example, a wire bond interconnects Q7 pad of the chip 201 and D7 pad of the chip 202 such that the link 311 is of a relatively short length. This reduces parasitic resistance, capacitance and inductance associated with the link.

In a similar manner as link 311, all other serial output pads of the first chip 201 can be interconnected to the respective serial input pads of the chip 202 in the stack.

Chip 201 can be secured to substrate 300. In the example embodiment, the parallel input pads, CE#, CK, VSS, VCC, CK# and RST#, of the second chip 202 are coupled to the conductive metallization bond areas or conductive traces 300D of substrate 300 by the links 313 such as, for example, bond wires. Thus, the memory storage system 100 according to embodiments herein can include connectivity between the substrate 300 and the memory stack of chips 201, 202, etc.

The stack of serially connected chips 201 and 202 may be physically attached to the substrate 300, in which the substrate may comprise, for example, a printed circuit board (PCB), a memory card, a lead frame, a tape automated bonding (TAB) tape or other type of substrate.

As mentioned above, the non-limiting example in FIG. 2 includes two chips in the respective stack. The serial output pads 202B of the second memory chip 202 are connected to corresponding pads or traces 300B of the substrate 300 via links such as, for example, wire bonds.

Additionally, links 310 connect the serial input pads 201A of the first chip 201 and the conductive metallization bond areas 300A of the substrate 300.

Additional conductive metallization bond areas or conductive traces 300C and 300D can be located on the surface of the substrate 300. Such bond areas can be provided in the both left and right sides of the stack in order to connect the common input signals and power supplies (such as RST#, CK#, VCC, VSS CK and CE#) to the parallel input bond pads of the first chip 201 and the second chip 202, respectively. In other words, because the chips are to be rotated with respect to each other in the stack, the bond pads for signals RST#, CK#, VCC, VSS CK and CE# on substrate 300 can be duplicated so that each chip in the stack can be connected to the substrate with a relatively short link.

To summarize embodiments of FIG. 3, the memory storage system includes a stacking of a first memory device such as chip 201 and a second memory device such as chip 202. By way of a non-limiting example, the first memory device (chip 201) and second memory device (chip 202) have a same input/output layout configuration.

As mentioned above, to form the stack, the second memory device (chip 202) is secured to the first memory device (chip 201). To facilitate connectivity between outputs of the first memory device (chip 201) and inputs of the second memory device (chip 202), the second memory device (chip 202) is rotationally offset with respect to the first memory device (chip 201) in the stack to align outputs of the first memory device (chip 201) with corresponding inputs of the second memory device. The chip 202 can be rotated about an axis along which the chips are stacked on top of each other.

The rotational offset of the second memory device (chip 202) with respect to the first memory device (chip 201) in the stack results in substantial alignment of one or more outputs of the first memory device (chip 201) with one or more respective inputs of the second memory device (chip 202). The stack of memory devices can include paths facilitating one or more series connection configurations between the first memory device (chip 201) and the second memory device (chip 202).

Referring again to FIG. 1, a first logical path through a respective stack of multiple memory devices includes a series configuration connection from input signal D0 of memory storage system 100 (for example, a pad on substrate 300) to the input pad associated with D0 of chip 200-1. The logical path in the chip continues to extend through a circuit path from pad D0 of chip 200-1 to an output pad Q0 of chip 200-1; through a physical link connecting the output Q0 of chip 200-1 to the input D0 of chip 200-2; through a circuit path from input pad D0 of chip 200-2 to an output pad Q0 of chip 200-2; through a physical link connecting the output Q0 of chip 200-2 to the input D0 of chip 200-3; chip 200 2; through a circuit path from pad D0 of chip 200-3 to an output pad Q0 of chip 200-3; through a physical link connecting the output Q0 of chip 200-3 to the input D0 of chip 200-4; through a circuit path from pad D0 of chip 200-4 to an output pad Q0 of chip 200-4, and so on.

A second logical path includes a series configuration connection from input signal D1 of memory storage system 100 to the input pad associated with D1 of chip 200-1. The second logical path continues to extend through a circuit path from pad D1 of chip 200-1 to an output pad Q1 of chip 200-1; through a physical link connecting the output Q1 of chip 200-1 to the input D1 of chip 200-2; through a circuit path from pad D1 of chip 200-2 to an output pad Q1 of chip 200-2; through a physical link connecting the output Q1 of chip 200-2 to the input D1 of chip 200-3: through a circuit path from pad D1 of chip 200-3 to an output pad Q1 of chip 200-3; through a physical link connecting the output Q1 of chip 200-3 to the input D1 of chip 200-4; through a circuit path from pad D1 of chip 200-4 to an output pad Q1 of chip 200-4, and so on. In a similar manner, the memory storage system 100 includes logical paths for each of signals D0 . . . D7, CSI, and DSI.

These series connection configurations through a stacking of memory devices will be discussed in more detail throughout this specification.

Referring again to FIG. 3, embodiments herein are useful over conventional methods because rotationally offsetting memory devices (for example, around 180 degrees) to align inputs from one chip to outputs of a successive chip in stack enables creation of a memory storage stack using memory devices having a common input/output layout configuration. This alleviates a need to stock memory devices having different input/output configuration layouts to create a memory stack.

The memory storage system according to embodiments herein can include a controller. Note that a controller can be coupled to the stack in a number of ways. For example, both a controller and the stack of chips can be attached to substrate 300 such as, for instance, a printed circuit board. In such an embodiment, conductive paths in the substrate 300 provide connectivity between the controller and the stack of memory devices.

In accordance with another embodiment, note that the stack of chips itself can include the controller. In such an embodiment, the controller can be secured to a memory device in the stack.

As illustrated in FIG. 3, the stack can be secured to the substrate 300. The substrate can be configured to attach to a printed circuit board via solder joints. For example, in one embodiment, the substrate 300 is a ball grid array type package and thus includes solder balls for connecting the stack assembly to a respective circuit board.

In other example embodiments, the substrate 300 is a pin grid array type package and thus includes pins on a bottom side of the substrate 300 for connecting the stack assembly to a respective circuit board.

As previously discussed, each chip in the stack can have the same input/output layout configuration. Thus, one chip can be replaced with another. Each chip includes input contacts and output contacts such as, for instance, surface pads on a single plane (for example, top plane) of the respective memory chip. Other embodiments can include pads located on both the top and bottom facings of the memory chip.

By way of a non-limiting example, the memory devices or chips in the stack can be planar-shaped and have a respective top facing and bottom facing. The top facing include input surface pads and output surface pads supporting off-chip connectivity. The memory devices can be semiconductor chips cut from one or more wafers.

In an example embodiment, the memory devices are stacked on top of each other in which a respective bottom facing of a memory device in the stack is secured to a top facing of another memory device in the stack such that the top facing of the first memory device and the top facing of the second memory device point in a same direction along the stack.

As previously discussed, the stack includes one or more serial configuration connections or paths based on connections between the input/output contacts. For example, the one or more paths can be created based on conductive links between output contacts such as signals Q0 . . . Q7, CSO, and DSO from one memory device in the stack to corresponding input contacts such as D0 . . . D7, CSI, and DSI of a successive memory device in the stack.

In one embodiment, the one or more paths are adapted to support conveyance of data through the stack. For example, a controller can be electrically coupled to the stack for accessing data stored in the stack. In one embodiment, the controller is coupled to the first memory device (chip 201) in the stack. Although, in other embodiments, the controller can reside at any position in the stack or external to the stack.

The controller can be configured to access data from the first memory device (chip 201) based on a flow of data along the path from the first memory device (chip 201) through the second memory device (chip 202) as well as other memory devices in the stack back to the controller. A connection between a last memory device in the stack back to the controller enables the controller to receive data from the memory devices in the stack based on a flow of data along the one or more paths.

The coupling between the controller and the first memory device (chip 201) in the stack enables the controller to convey data through the memory devices and thus store data in the memory devices. The coupling between the last memory device in the stack back to the controller enables the controller to retrieve data stored in the respective memory devices.

Each memory device (chip 200) in the stack can be set to a pass-through mode or a memory access mode. In one embodiment, the pass-through mode enables a respective memory device (chip 200) in the stack to convey data received at an input of the respective memory device along a circuit path to an output of the respective memory device. Thus, the controller can cause data to pass through one or more memory device in the stack for storage in a target memory device in the stack.

The memory access mode enables i) reception of data on the path and storage of the data to memory circuitry associated with a respective memory device in the stack, and ii) retrieval of data from the memory circuitry in the respective memory device for transmission on the path to an output of the respective memory device back to the controller. Thus, the controller can cause data to be stored or retrieved from a retrieved from a particular memory device in the stack.

More details of access operations (such as, for example, storing and retrieving data) associated with the memory storage system 100 are discussed in the related applications incorporated reference as cited above. Embodiments herein enable such operations with respect to a memory storage stack.

Each of the one or more paths through the stack can include path segments through the memory devices. For example, as shown in FIG. 3, a series configuration path such as, for instance, that associated with signal D0 includes path segment 325-1 and path segment 325-2.

The path segment 325-1 resides in chip 201 and includes a respective circuit path between input D0 and output Q0 of the chip 201. The path segment 325-2 resides in chip 202 and includes a circuit path between an input D0 and output Q0 of chip 202.

Based on the rotational offset of chip 202 with respect to chip 201 in the stacking, an axis between the input D0 and output Q0 of the chip 201 in the stack is substantially parallel to an axis between the input D0 and output Q0 of chip 202 in the stack.

Also, based on an orientation of chip 202 with respect to chip 201 in the stack, a direction of data flow from the input D0 to the output Q0 of chip 201 can be substantially opposite to a direction of data flow from the input D0 to the output Q0 of chip 202 even though both path segments 325 are part of the same overall path for conveying data through the stack. For example, the path segment 325-1 of a logical path through the stack can diagonally traverse a plane of chip 201 from an input D0 in proximity to an edge of the chip 201 to an output Q0 near an opposite edge of the chip 201. The second path segment of the logical path through the stack can diagonally traverse a plane of chip 202 from an input D0 in proximity to near an edge of chip 202 to an output Q0 near a respective opposite edge of the chip 202.

Thus, a path through a stack of memory devices can "zig-zag" back and forth in each successive chip layer.

Figure 4:
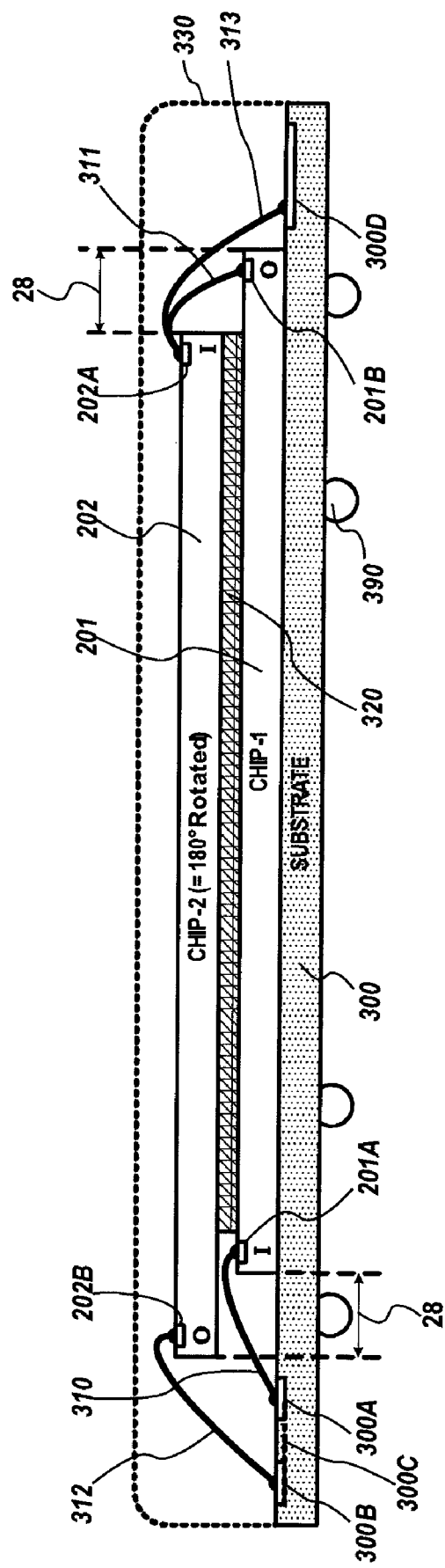
FIG. 4 is an example cross-sectional diagram illustrating a stacking of interconnected memory devices according to embodiments herein.

FIG. 4 is a cross sectional view of the example 2-chip stacking illustrated in FIG. 3 along view AA-AA according to embodiments herein. As shown in this cross sectional view, the links 310 such as, for example, wire bonds couple the serial input pads 201A of the bottom first chip 201 to the conductive metallization bond areas 300A.

Note that FIG. 4 illustrates an interposer layer 320 including, for example, insulation material. The interposer 320 between the two chips 201 and 202 can be configured to provide enough room for the loop height associated with respective links such as, for example, wire bonds 310. That is, the spacing provided by interposer 320 reduces a possibility that a respective link will be damaged by chip 202 being laid on to of chip 201.

A controlled thickness of thermoplastic or other type of adhesive may be used in the interposer layer 320 to secure memory chip 201 to chip 202. For example, a relatively thin adhesive layer can be used to join the first memory chip 201 to the substrate 300. Such an adhesive layer may aid in dissipation of heat from the stack of chips to the substrate 300. As will be appreciated by those skilled in the art, a heat sink layer may be inserted in between the chips if the stacked chips are required to be cooled.

The links 310, 311, 312, 313 may be bond wires having a diameter of about 0.001 inch and being formed of a metal such as aluminum or gold, or alloys thereof. One method of creating connections is done by bonding the links 310, 311, 312, 313 to the respective pads of the chips via techniques such as, for instance, ultrasonic ball bonding, which forms a low-loop wire bond which, in an example embodiment, is less than the thickness of the interposer layer 320.

Likewise, in accordance with certain example embodiments, ultrasonic "wedge" bonds of wire may be formed at the conductive metallization bond areas 300A, 300B, 300C, 300D.

Offset distance 28 is shown on both sides of the stacked chips and represents an amount of staggering (i.e., offsetting) one memory device with respect to another in the stack. The offset distance 28 on each side of the stack will be the same value if the top and bottom chips in the stack are the same type of semiconductor chips.

By way of a non-limiting example, the offset distance 28 may be the shortest distance permitting reliable use of a wire-bonding tool to bond conductors such as, for instance, bond wires 311 to the bond pads 201B. In one embodiment, fine metal bond wires or other conductive members physical link bond pads 201B, 202A to conductive metallization areas 300D on the top side of the substrate 300.

The substrate 300 can be a multi-layered device such as, for example, a printed circuit board, and can have multiple solder balls 390 as mentioned above. The memory chips 201 and 202 can be encapsulated in a protective package to protect the chip surfaces, metallization, and bond wires from damage.

Edges of an example equiangular encapsulating enclosure are defined by dashed line 330. By way of a non-limiting example, the encapsulating material can be a polymer, ceramic or other suitable protective material.

Figure 5:
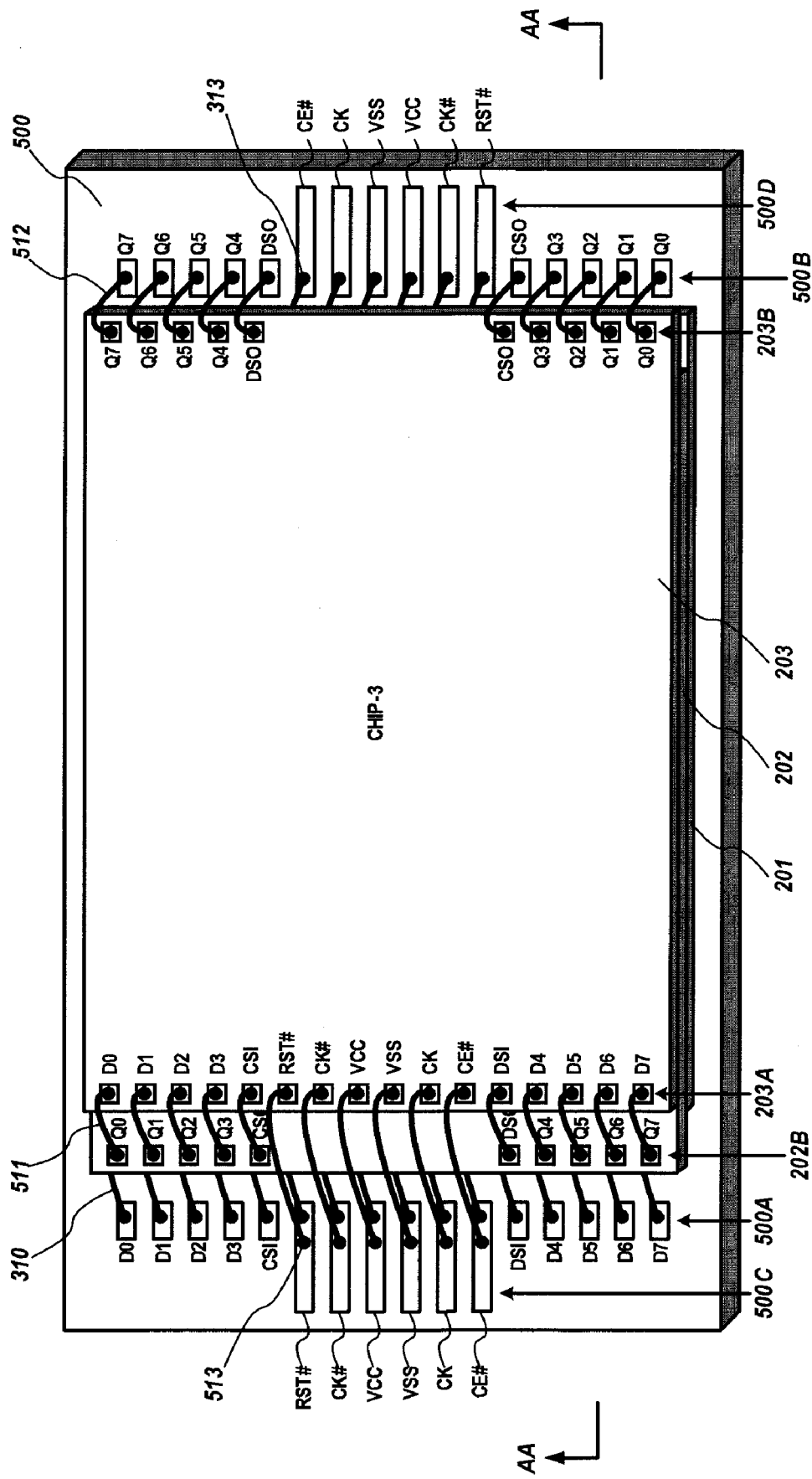
FIG. 5 is an example 3-dimensional diagram of a memory system including multiple stacked memory devices according to embodiments herein.

In the example embodiment illustrated in FIG. 5, three chips are stacked on each other in a vertical direction to form a memory storage stack according to embodiments herein. The middle chip 202 is 180 degree rotated and slightly offset relative to the other two chips 201 and 203.

Since in this example embodiment there are three chips in series connection, utilizing the proposed reverse mirrored pad arrangement scheme, the third chip 203 becomes the "last" chip and its serial output pads 203B are connected to conductive metallization bond areas 500B of the substrate 500.

As previously discussed, the stack of chips can generally include any reasonable number of memory devices. Addition of each memory device to the memory storage stack and respective linkage extends the series connections or paths through each memory device in the stack such as first memory device, second memory device, third memory device, etc.

In the example embodiment of FIG. 5, the stack includes chip 203 secured to chip 202. The third chip (chip 203) has the same input/output layout configuration as chip 201 and chip 202.

To align outputs of the chip 202 with corresponding inputs to the chip 203, the chip 203 is rotationally offset with respect to the chip 202. Chip 203 is thus aligned directly over chip 201. Accordingly, embodiments herein include rotationally offsetting each successive chip or memory device in the stack to expand a length of a series connection configuration through the stack.

In the above example, addition of chip 203 to the stack extends the serial configuration paths through chips 201, 202, and 203 for conveyance of data and/or control strobe signals.

As previously discussed, stacking of memory devices can include rotationally offsetting each successive memory device in the stack.

In further embodiments, the memory devices can be staggered by an amount as specified by offset distance 28. For example, chip 203 can be staggered or offset with respect to chip 202 in the stack to expose outputs on a plane of chip 202 for electrically connecting to inputs on a plane of chip 203. This technique of staggering the chips can be repeated through layers of the stack so that outputs of one memory device are exposed for connecting to inputs of a successive memory device.

Figure 6:
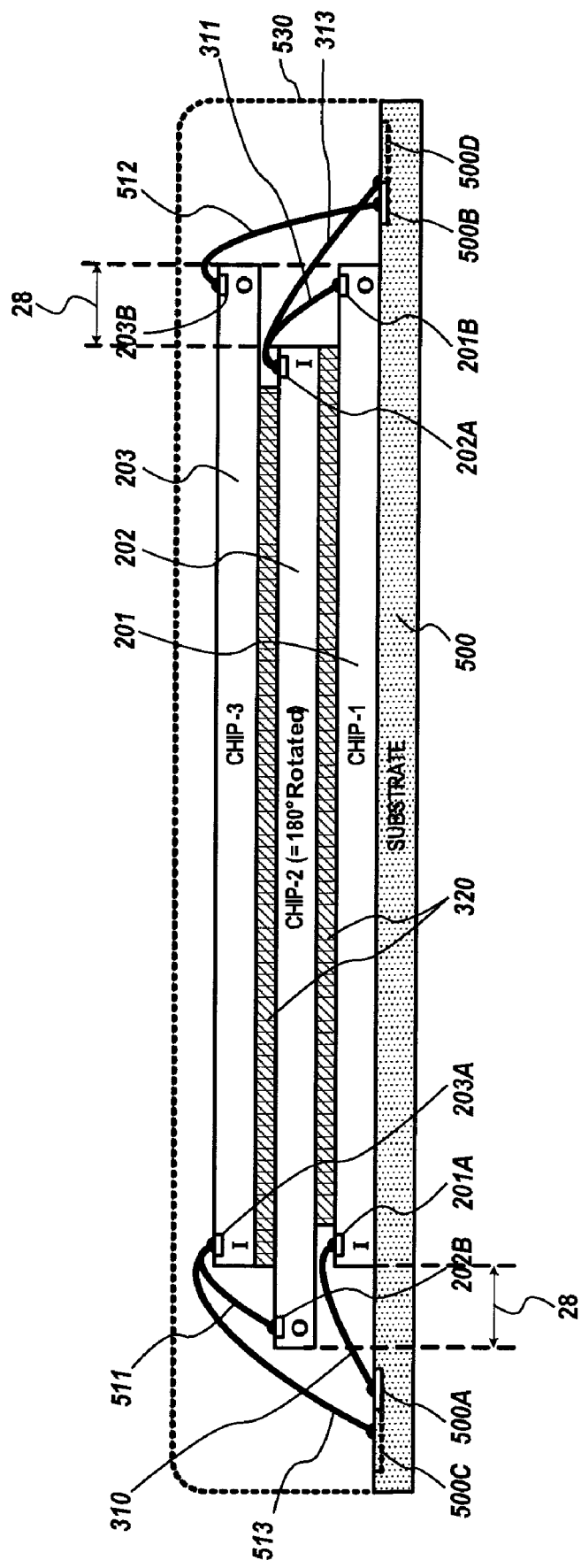
FIG. 6 is an example cross-sectional diagram illustrating a stacking of interconnected memory devices according to embodiments herein.

FIG. 6 is a cross sectional view of a 3-chip stack (FIG. 5) as viewed along AA-AA according to embodiments herein. As shown, interposer layer 320 separates each successive chip in the stack. Successive chips are in the stack are offset by an offset distance 28.

The conductive metallization bond areas 500C for the common input signals can be used to support wire bonding to both chips 201 and 203. Link 511 such as, for example, a wire bond support connectivity between the serial output pads 202B of chip 202 to the serial input bond pads 203A of chip 203. The conductive metallization bond areas 500D for the common input signals can be used to support wire bonding to chip 202.

Figure 7:
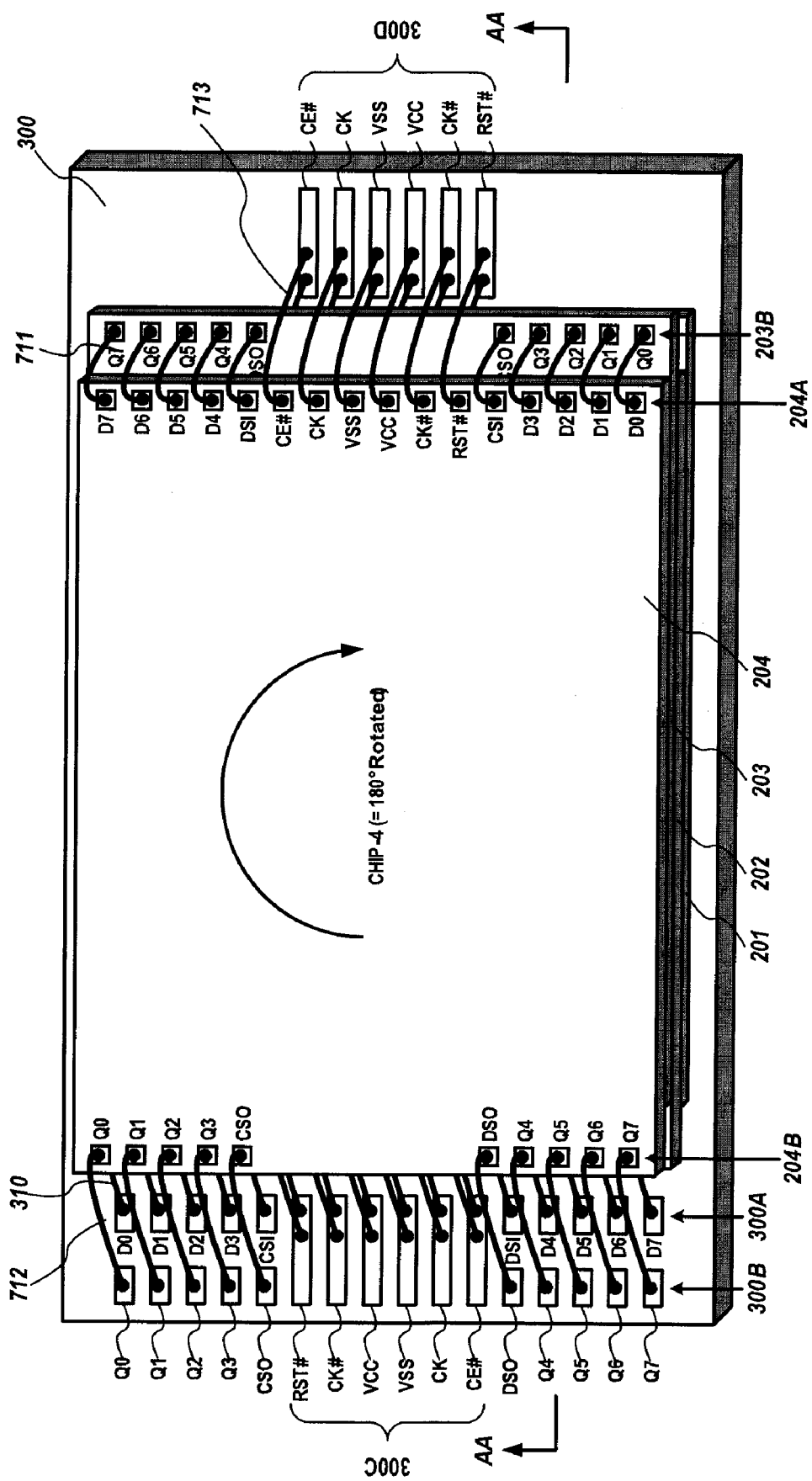
FIG. 7 is an example 3-dimensional diagram of a memory system including multiple stacked memory devices according to embodiments herein.

In the example embodiment illustrated in FIG. 7, four chips are stacked in vertical direction. The second chip 202 and the fourth chip 204 are both 180 degrees rotated and slightly offset relative to the other two chips 201 and 203. Since, in this example embodiment, there are four chips in series connection utilizing the proposed reverse mirrored pad arrangement scheme, the fourth chip 204 becomes the last chip and its serial output pads 204B should be connected to conductive metallization bond areas 300B of the substrate 300.

Figure 8:
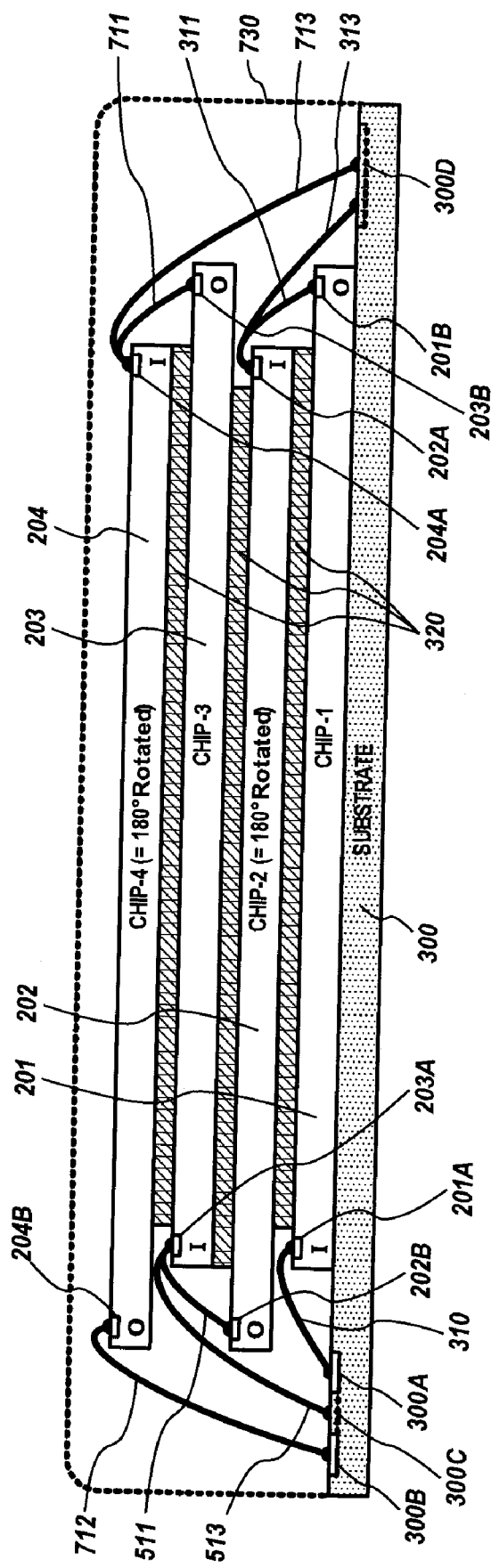
FIG. 8 is an example cross-sectional diagram illustrating a stacking of interconnected memory devices according to embodiments herein.

FIG. 8 is a cross sectional view of the 4-chip stack of FIG. 7 as viewed along AA-AA according to embodiments herein. The stack includes three interposer layers 320. One chip to the next chip is offset by offset distance 28.

The conductive metallization bond areas 300C for the common input signals provide connectivity to chips 201 and 203. Also, the conductive metallization bond areas 300D for the common input signals provide connectivity to chips 202 and 204. The serial output pads 202B of the second chip 202 are coupled to the serial input bond pads 203A of the third chip 203. The serial output pads 203B of the third chip 203 are coupled to the serial input bond pads 204A of the fourth chip 204.

A foot print or volume consumed by the memory storage stack can be limited because each successive memory device added to the stack is offset in a direction opposite to the offset in a last pair of memory devices. For example, chip 202 is offset in a direction with respect to chip 201. Chip 203 is offset in an opposite direction with respect to chip 202. Chip 204 is offset with respect to chip 203 in a same direction and manner that chip 202 is offset with respect to chip 201.

Figure 28:
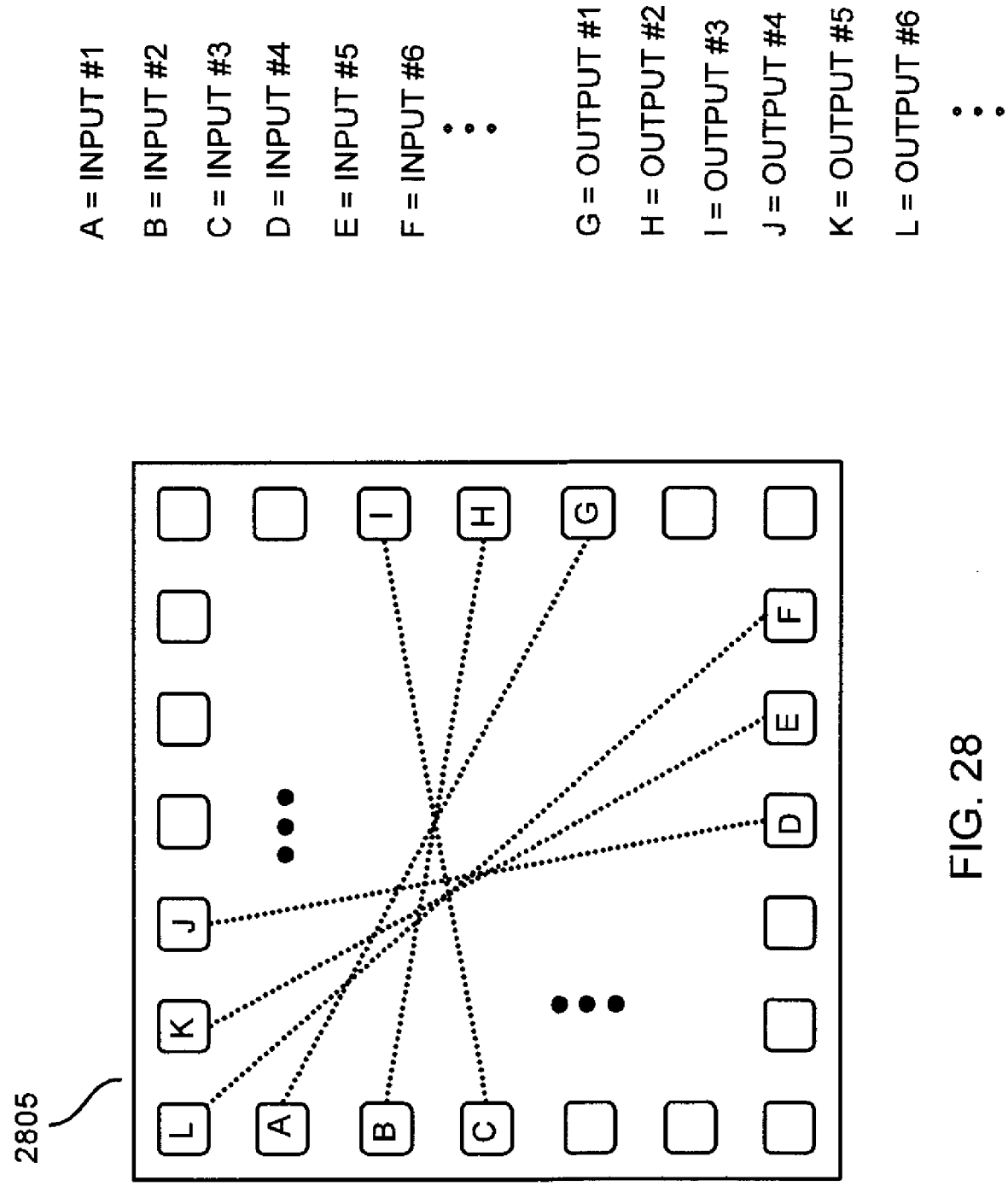
FIGS. 28-30 are example diagrams illustrating stackable memory devices according to embodiments herein.

FIG. 28 is an example diagram illustrating another chip layout according to embodiments herein. As shown, the chip 2805 such as, for example, a memory device includes multiple inputs/outputs along its corresponding edges.

In a manner as discussed above, each input is paired with a corresponding output of chip 2805. For example, input A of chip 2805 links to output G of chip 2805 via a corresponding circuit path through chip 2805; input B links to output H via a corresponding circuit path through chip 2805; input C links to output I via a corresponding circuit path through chip 2805; input D links to output J via a corresponding circuit path through chip 2805; input E links to output K via a corresponding circuit path through chip 2805; and input F links to output L via a corresponding circuit path through chip 2805. In a manner as discussed above, each corresponding circuit path can include memory for accessing data as well as provide a path through the respective chip 2805 as previously discussed.

Figure 29:
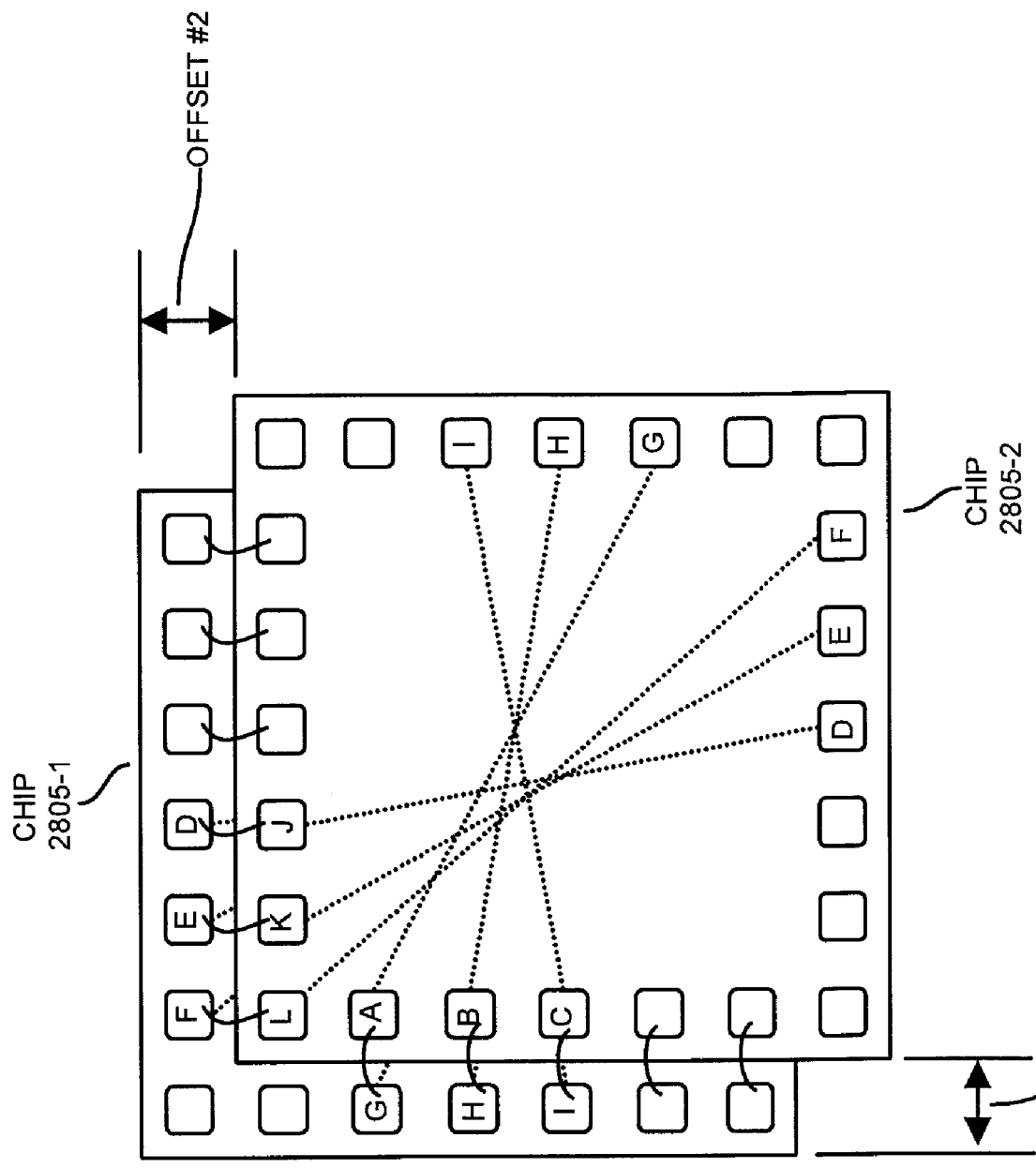

FIG. 29 is an example diagram illustrating a top view of multi-axis offsetting of chips 2805 to form a memory stack according to embodiments herein. For example, chip 2805-1 and chip 2805-2 form a memory stack in which the outputs of chip 2805-1 (a first chip layer) are connected to the inputs of successive memory device chip 2805-2 (a second chip layer) via links such as, for example, wire bonds.

Stacking of the chips 2805 is similar to the embodiments as discussed above with respect to FIGS. 3-8. However, stacking of chips 2805 can include multi-axis offsetting of one chip 2805-2 with respect to another chip 2805-1 in the stack such that the outputs of along multiple edges of one chip are aligned with multiple inputs of a next successive chip in the memory stack. Chip 2805-2 is offset by an amount such as, for example, offset #1 (on a first axis) with respect to chip 2805-1 in the stack. Chip 2805-2 is offset by an amount such as, for example, offset #2 (on a second axis) with respect to chip 2805-1 in the stack.

More specifically, as shown in the two-chip stack of FIG. 29, chip 2805-2 is offset with respect to chip 2805-1 such that: output I of chip 2805-1 substantially aligns with input C of chip 2805-2; output H of chip 2805-1 substantially aligns with input B of chip 2805-2; output G of chip 2805-1 substantially aligns with input A of chip 2805-2; output F of chip 2805-1 substantially aligns with input L of chip 2805-2; output E of chip 2805-1 substantially aligns with input K of chip 2805-2; output D of chip 2805-1 substantially aligns with input J of chip 2805-2; and so on.

In a manner as previously discussed, the outputs of chip 2805-1 can be coupled to inputs of chip 2805-2 via links such as, for example, wire bonds or other suitable conductive path.

Figure 30:
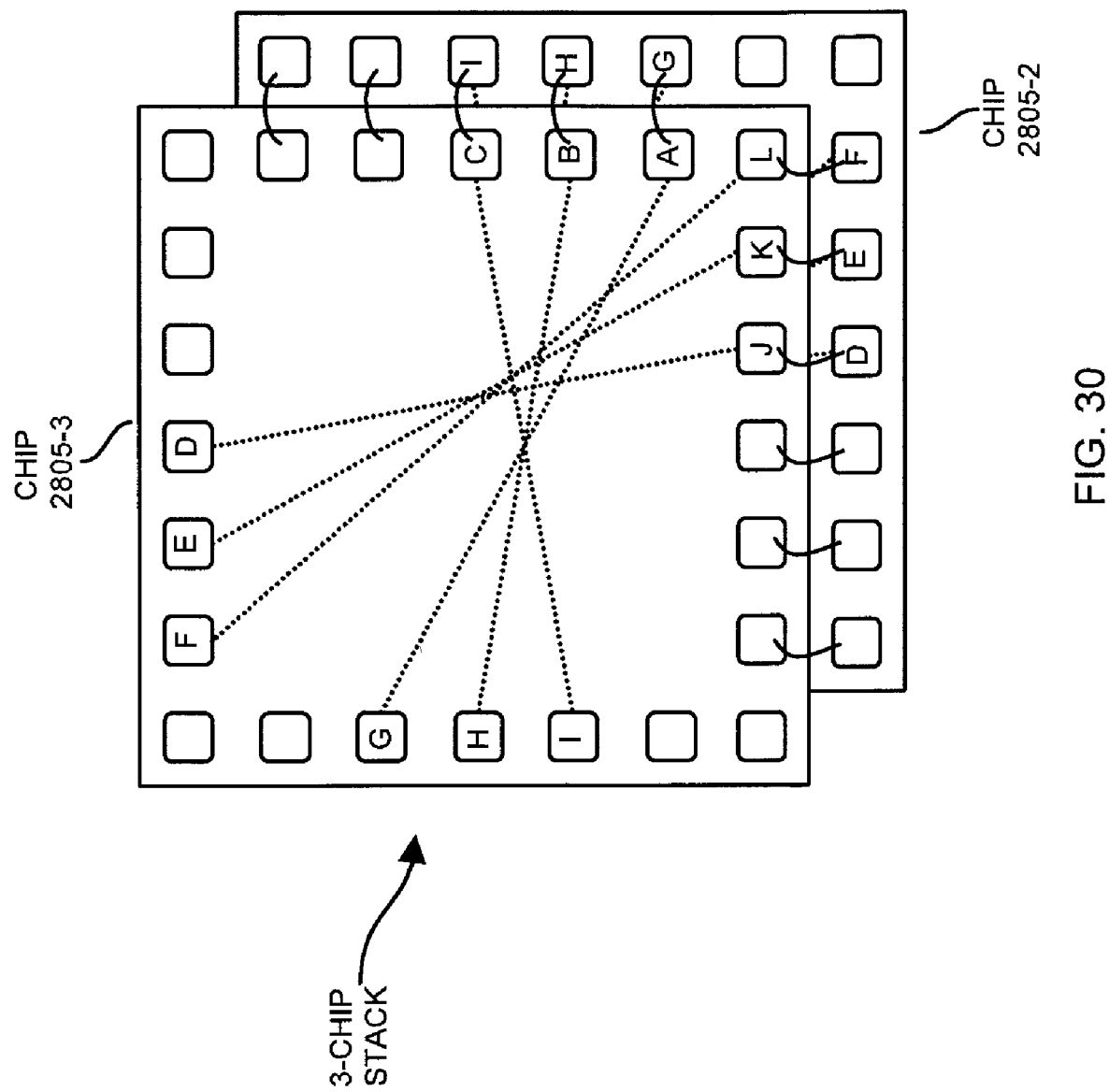

FIG. 30 is an example diagram illustrating a top view of multi-axis offsetting of chips 2805 to form a 3-chip memory stack according to embodiments herein. For example, chip 2805-3 and chip 2805-2 form an example top portion of the memory stack (as previously discussed with respect to FIG. 29) in which the outputs of chip 2805-2 (a second chip layer) are connected to the inputs of successive memory device chip 2805-3 (a third chip layer). Accordingly, any suitable number of chips 2805 can be stacked atop each other to form a memory stack based on multi-axis offsetting of one chip to a next chip in the stack.

Figure 9:
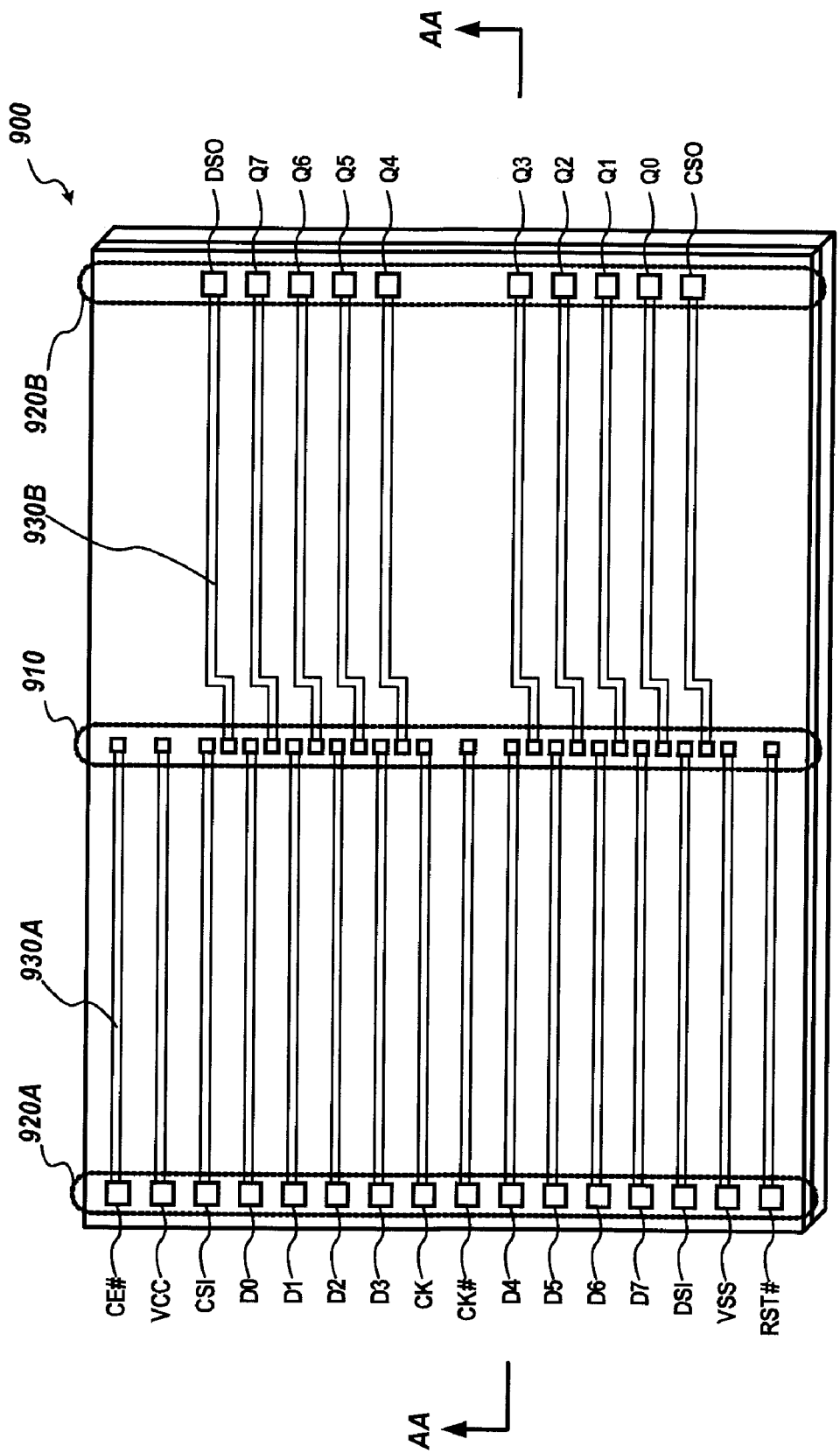
FIG. 9 is an example 3-dimensional diagram illustrating a connectivity layer according to embodiments herein.
Figure 10:
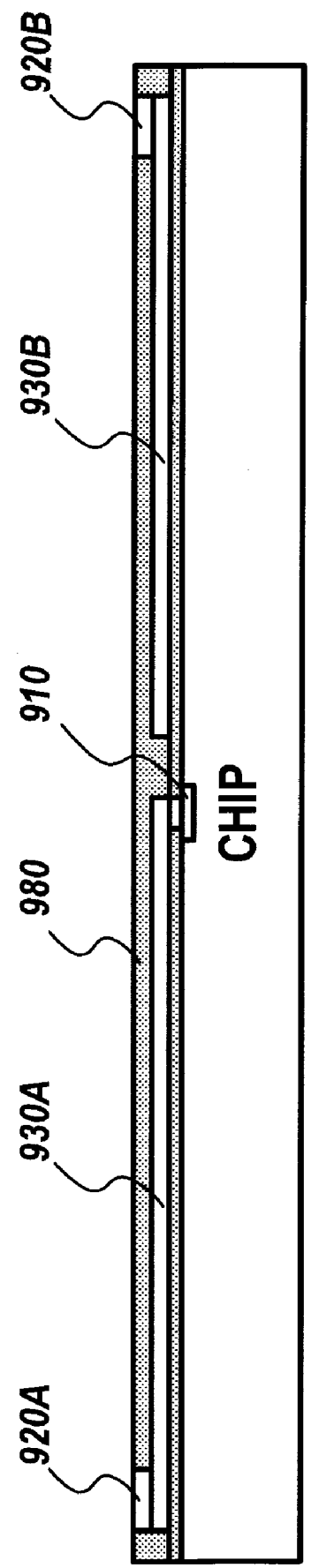
FIG. 10 is an example cross-sectional diagram of a connectivity layer according to embodiments herein.

FIG. 9 and FIG. 10 illustrate an alternative example embodiment including redistribution layers (RDLs) according to embodiments herein. FIG. 9 provides a top view of the redistribution layer according to embodiments herein. FIG. 10 provides a cross-sectional view of the redistribution layers according to embodiments herein.

In general, the redistribution layers can be utilized in order to create a more useful bond pad arrangement.

Referring to FIG. 9, semiconductor chip 900 comprises "original" (i.e. existing prior to redistribution layering) conductive pads 910 laid out in the middle of the active surface of the chip 900. In one embodiment, it is useful to extend these signal pads to an edge of the semiconductor chip to facilitate connectivity such as, for example, wire bonding.

Thus, inputs/outputs can be purposely re-distributed by the RDL 930A and 930B as shown so that the input/outputs are located at more convenient on the respective semiconductor chip.

Those skilled in the art will appreciate that an additional example pad arrangement is suggested. In particular, two clock signals CK and CK# are located in between serial data input signal pads D0 to D7. Other common input signals and two power supplies are located at the top and bottom. The serial output signal bond pads (i.e. DSO, Q7, Q6, Q5, Q4, Q3, Q2, Q1, Q0, CSO collectively labeled 920B) are arranged in reverse order as compared to the order of serial input signal bond pads (i.e. CSI, D0, D1, D2, D3, D4, D5, D6, D7, DSI collectively labeled 920A). The chip 900 can be stacked in a manner similar to those previously illustrated.

Figure 11:
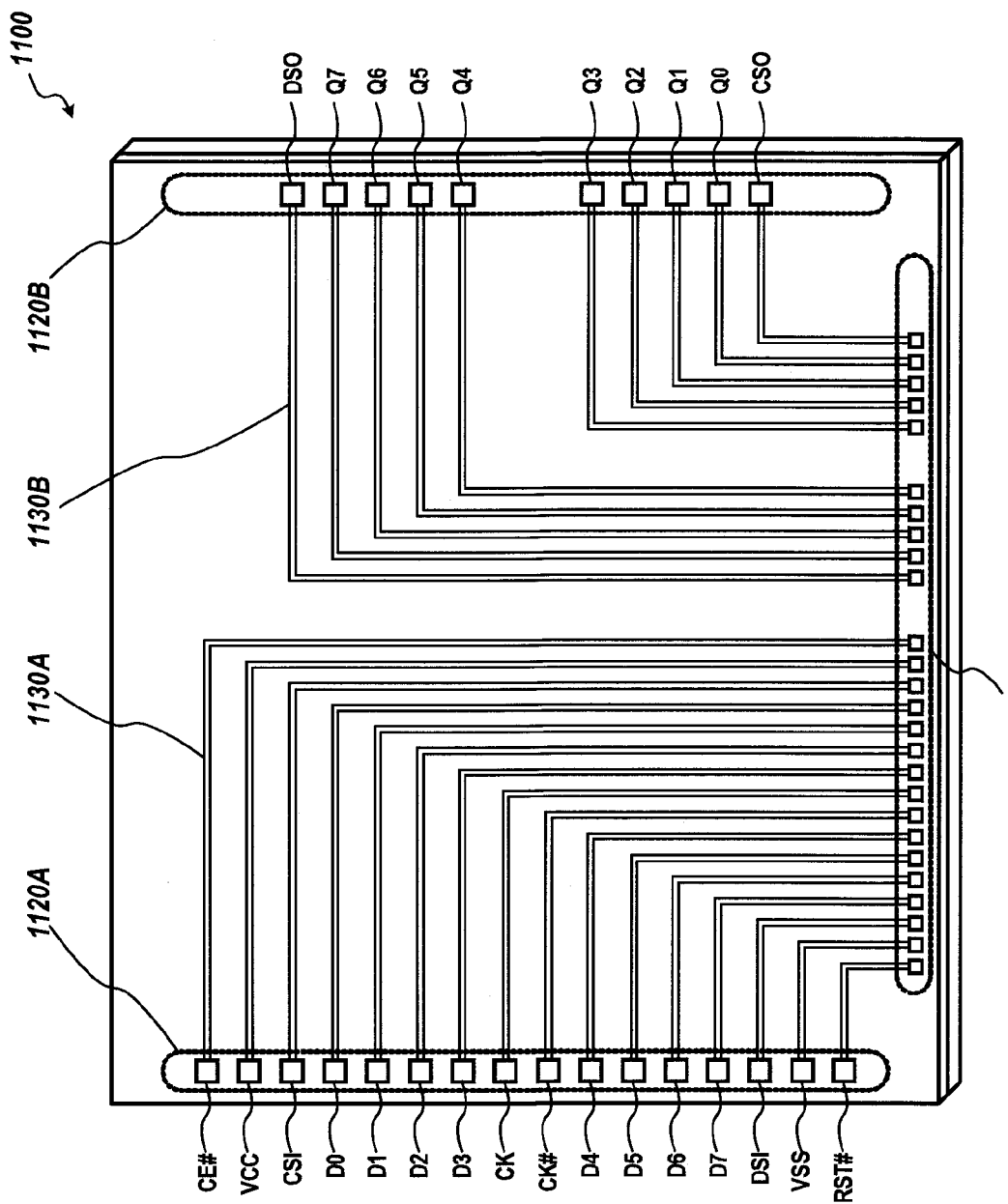
FIG. 11 is an example 3-dimensional diagram illustrating a connectivity layer according to embodiments herein.

FIG. 11 is an example diagram of a circuit pad arrangement in accordance with an example embodiment. This example embodiment is similar to the example embodiment illustrated in FIG. 9. However, the redistribution layer in FIG. 11 changes the location of the original conductive pads of the semiconductor memory chip.

For example, the original conductive pads 1110 are located in the bottom of the chip 1100. These pads are re-distributed on the chip via the RDL 1130A and 1130B to the wire bond pads group 1120A and 1120B respectively. Note that the serial output signal bond pads (i.e. DSO, Q7, Q6, Q5, Q4, Q3, Q2, Q1, Q0, CSO) in 1120B are arranged in reverse order compared to the order of serial input signal bond pads (i.e. CSI, D0, D1, D2, D3, D4, D5, D6, D7, DSI) in 1120A.

Figure 12:
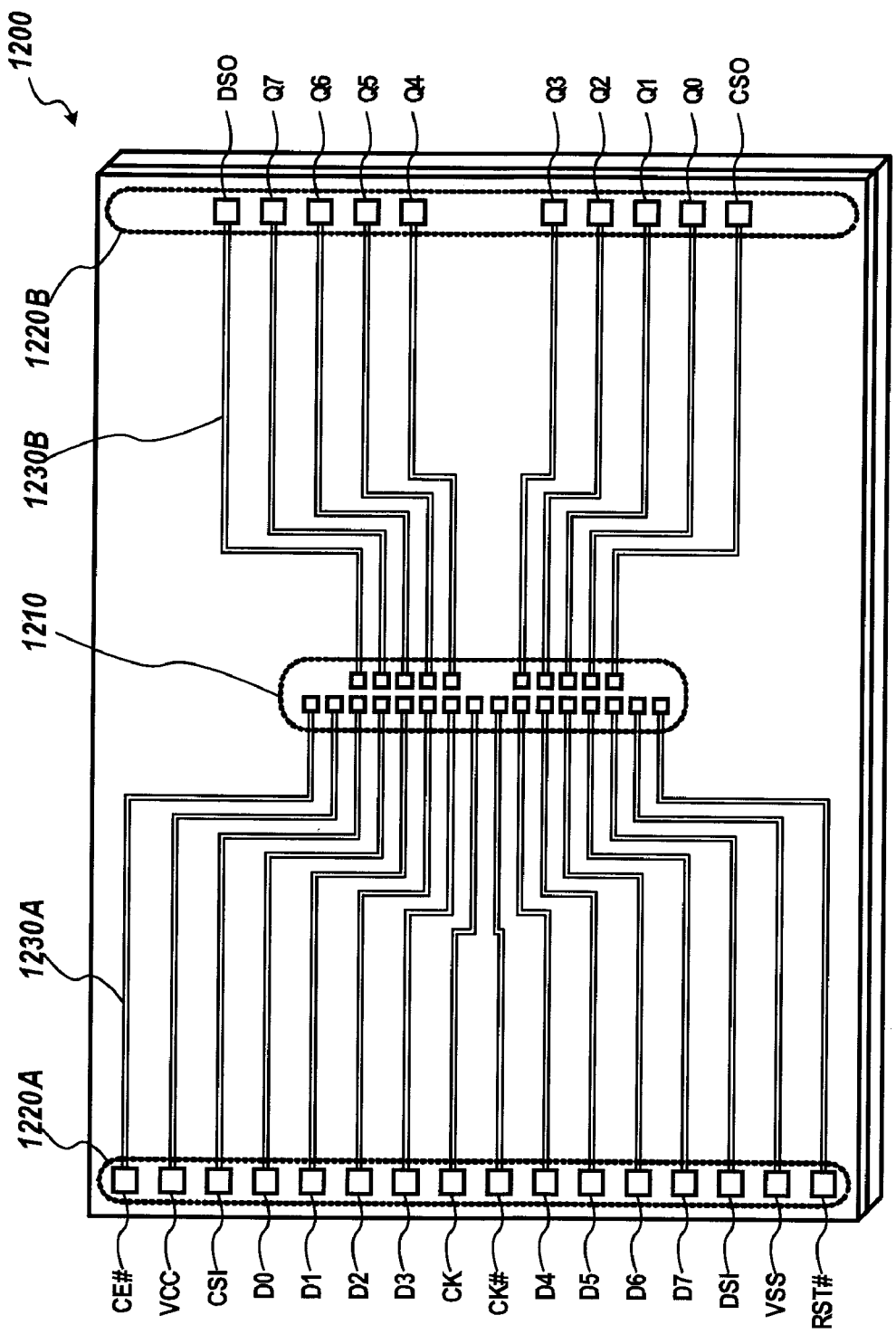
FIG. 12 is an example 3-dimensional diagram illustrating a connectivity layer according to embodiments herein.

FIG. 12 is an example diagram of a dual circuit pad arrangement in relation to chip-center with redistribution layers and bond pads according to embodiments herein.

This example embodiment is similar to the example embodiment illustrated in FIG. 10. However, FIG. 12 includes a difference in the location of the original conductive pads of the semiconductor memory chip 1200.

The two vertical rows of the original conductive pads 1210 are located in the center of the chip 1200 and they are re-distributed by the RDL 1230A and 1230B to the wire bond pads group 1220A and 1220B respectively. The serial output signal bond pads (i.e. DSO, Q7, Q6, Q5, Q4, Q3, Q2, Q1, Q0, CSO) in 1220B are arranged in reverse order compared to the order of serial input signal bond pads (i.e. CSI, D0, D1, D2, D3, D4, D5, D6, D7, DSI) in 1220A.

Figure 13:
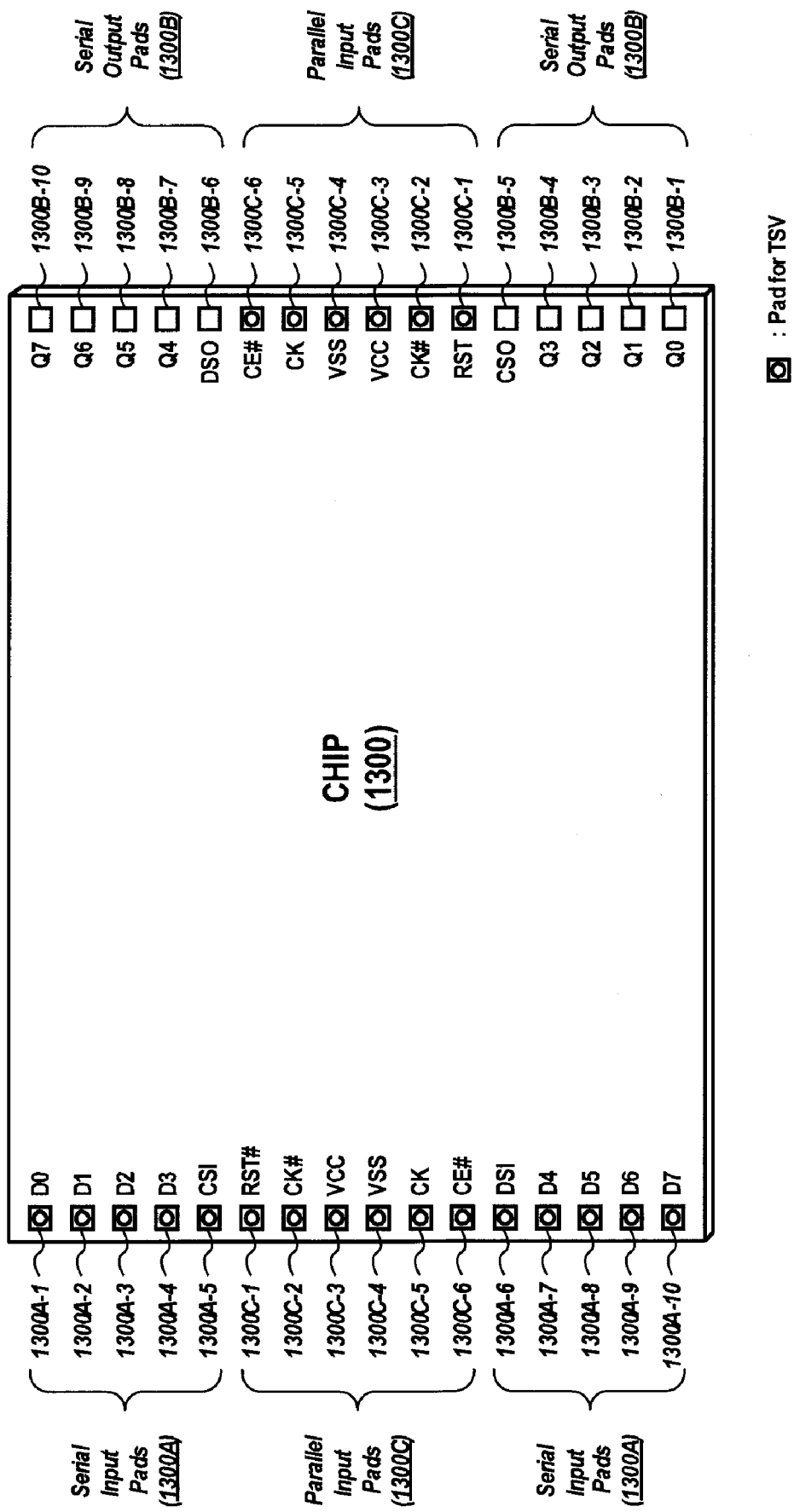
FIG. 13 is an example 3-dimensional diagram of a memory device and layout of through-holes and surface pads according to embodiments herein.

FIG. 13 is a diagram illustrating an example embodiment implementing through-hole technology such as, for instance, TSV (Through-Silicon-Via). In certain respects, the example embodiments discussed above carry over to chip 1300. For example, the concept of rotating every second chip in the stack 180 degrees and having the reverse ordered serial output pads on the opposite side of the semiconductor chip is similarly present in both examples.

More specifically, note that the internal circuitry associated with the chip 1300 can be the same as that discussed with respect to chip in FIG. 2. However, the chip 1300 includes a unique input/output connections supporting connectivity amongst successive layers in a stack.

In accordance with FIG. 13, a square pad with a circle inside denotes that the corresponding input/output associated with the chip is a through-hole connector in accordance with TSV. The square pads without a circle inside indicate surface pads on a planar surface of the chip 1300 for attaching links such as, for example, wire bonds.

In the example embodiment shown, the signals D0, D1, D2, D3, CSI, RST#, CK#, Vcc, VSS, CK, CE#, DSI, D4, D5, D6, D7 in the left column of input/outputs of chip 1300 are allocated as through-hole connections as well as RST#, CK#, Vcc, VSS, CK, CE#, in the right column of chip 1300. Signals Q7, Q6, Q5, Q4, DSO, CSO, Q3, Q2, Q1, Q0 in the right hand column of chip 1300 are allocated as surface pads.

In one embodiment, the surface pads of chip 1300 enable connectivity with other resource based on wire bonding to the surface pads or connection of a through-hole connector of another device to the surface pads as will be discussed later in this specification.

More specifically, the chip 1300 can include a layout configuration of multiple inputs and outputs. Similar to embodiments as discussed above, the semiconductor chip includes a respective input-output circuit path between the inputs and the outputs to convey data through the semiconductor chip on a number of paths.

As mentioned above, certain inputs can be configured as through-hole connectors or so-called vias (TSVs). Certain outputs can be configured as surface contact pads disposed on a planar surface of the semiconductor chip 1300.

Such an embodiment is useful because a connection between one semiconductor chip and a next semiconductor chip of the same input/output configuration can be connected via a link between a respective surface pad and through-hole connection. That is, the through-hole connectors (those marked by a circle within a square) of the semiconductor chip 1300 enable connectivity between a surface contact pad (those marked by respective squares without corresponding circles inside) at the output of the semiconductor chip 1300 to a through-hole connector at an input of another semiconductor chip having the same layout configuration.

Note that TSV technology can reduce a stack footprint and increase package efficiency along with providing for short interconnect length compared to the wire-bonds. As will be appreciated by those skilled in the art, a short interconnection provides less parasitic effects like inductance, capacitance and resistance so that signal integrity of a respective MCP may, in at least some example, be better than the case of wire-bond.

Additionally, a low profile without an interposer for accommodating the loop height of the bond wires can be beneficial. For example, the size of respective memory storage stack may be minimized as compared to a memory system including spacings between each respective successive memory device in the stack. There is also no staggering of chips from one chip layer to the next, which reduces an effective volume of the stack.

3D chips stacking packaging technologies are often using DRIE (Deep Reactive Ion Etching) to etch Through-Silicon-Via (TSV) for advanced interconnections. The step of creating a respective TSV interconnection can be done "prior" to or "post" wafer thinning. The techniques involve different etch processes.

For example, the "via first" approach includes etching a through-hole connection prior to a grinding step. Blind vias can be created using the DRIE technology. A typical etch depth for a blind via can be around 80 µm, although this can vary depending on the embodiment.

A so-called refilling process to create a connection between one chip layer and another may be simpler when the through-hole connectors have a slightly tapered cross-sectional profile.

Via formation method may be one of, for example, DRIE or Laser drilling technology. Materials for filling the through-hole connections include, for example, Cu, poly-Si, W and conductive polymers. The filling process can include, for example, ECD (electro-chemical deposition), CVD (Chemical vapor deposition), coating, etc.

3D stacking method may be one of, for example, W2W (Wafer-to-wafer), C2W (Chip-to-wafer) and C2C (Chip-to-chip). Bonding technology may be one of, for example, solder-ball, Cu-to-Cu, adhesive, hybrid and direct fusion.

In at least some instances of the example embodiment illustrated in FIG. 13, as discussed above, all connectors in the chip 1300 are TSV except for the serial output pads 1300B, which are surface pads instead of through-holes. As mentioned above, such an embodiment is useful for creating stacks of interconnected memory devices as discussed in the following figures.

Figure 14:
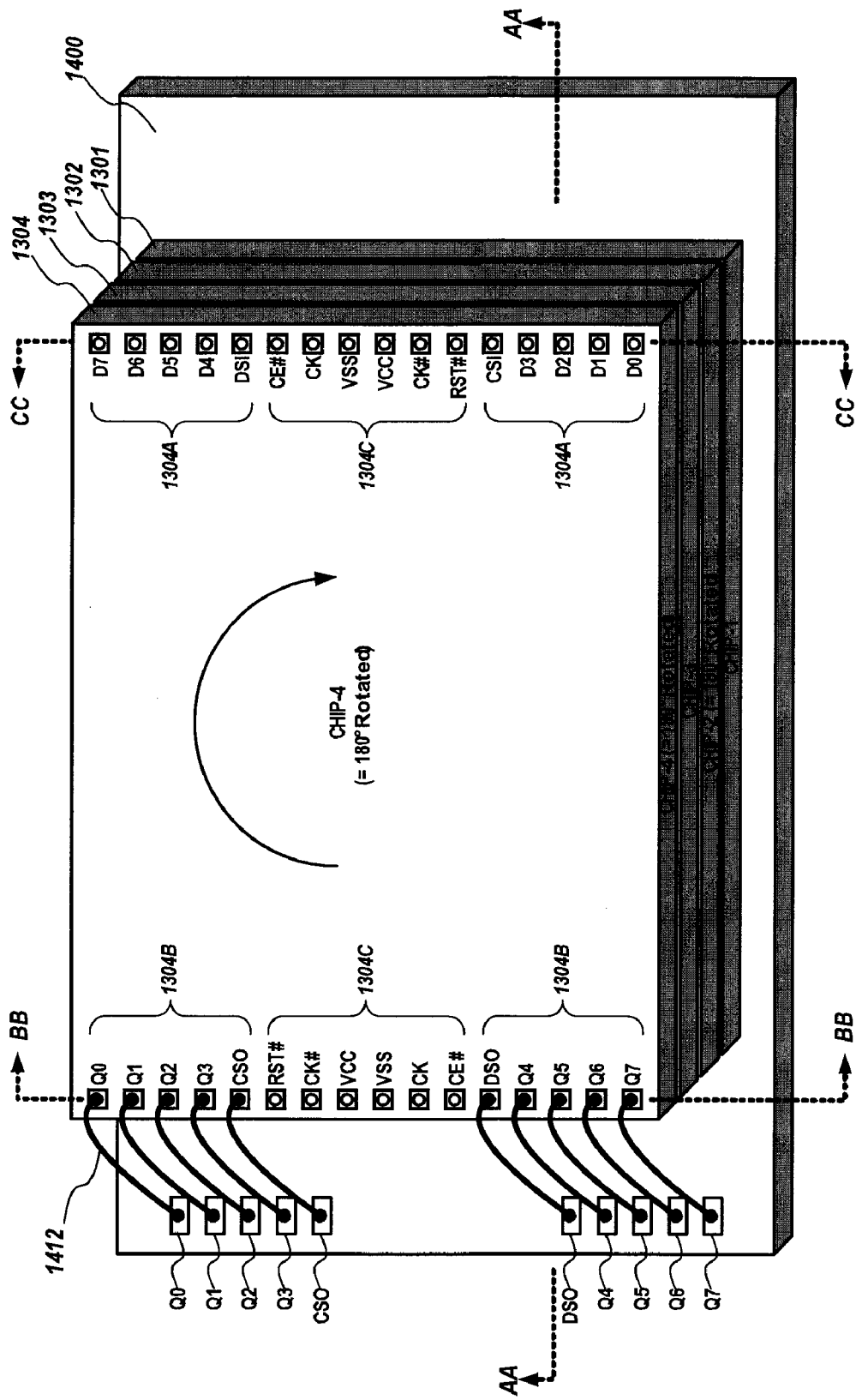
FIG. 14 is an example 3-dimensional diagram illustrating a stacking of memory devices according to embodiments herein.
Figure 15:
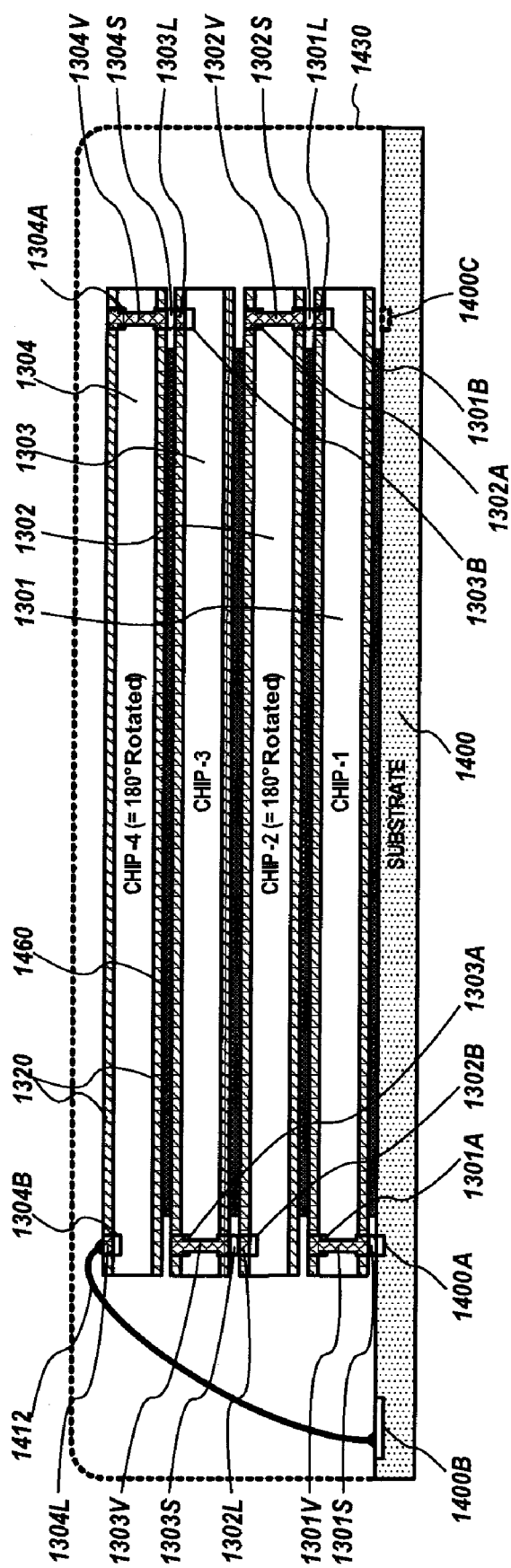
FIGS. 15, 16, and 17 are example cross-sectional diagrams illustrating connectivity associated with a stack of memory devices according to embodiments herein.
Figure 16:
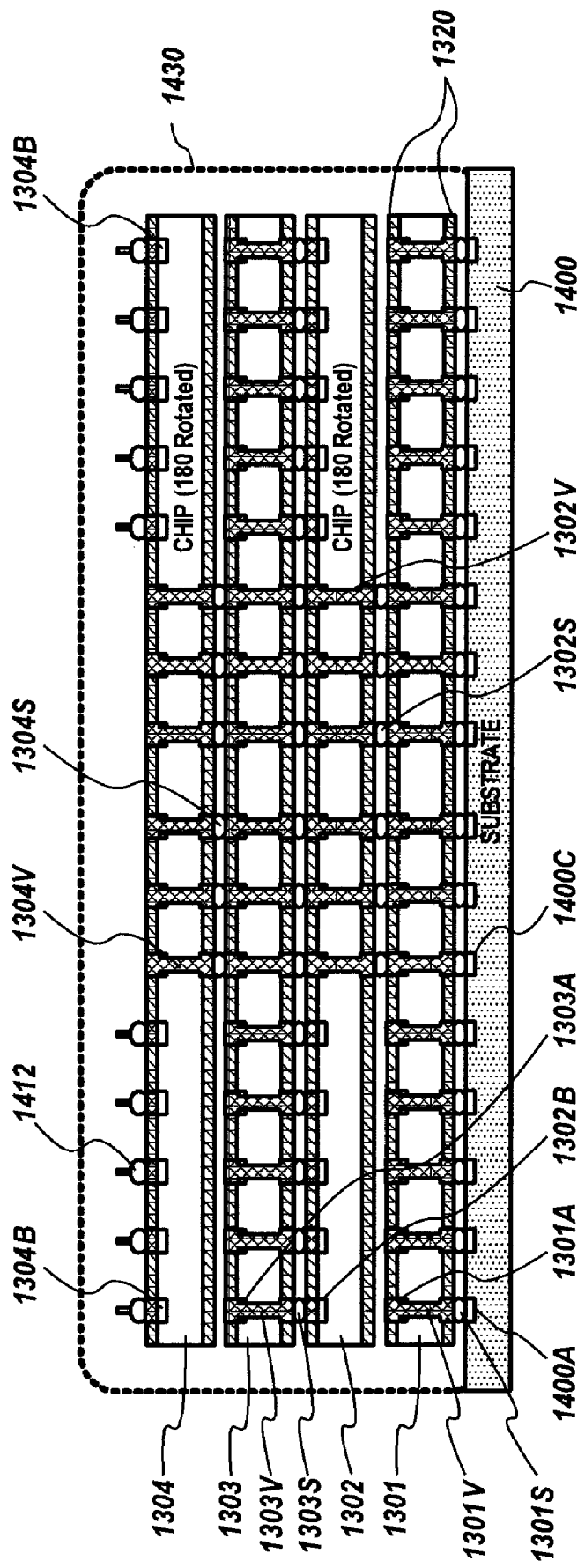
Figure 17:
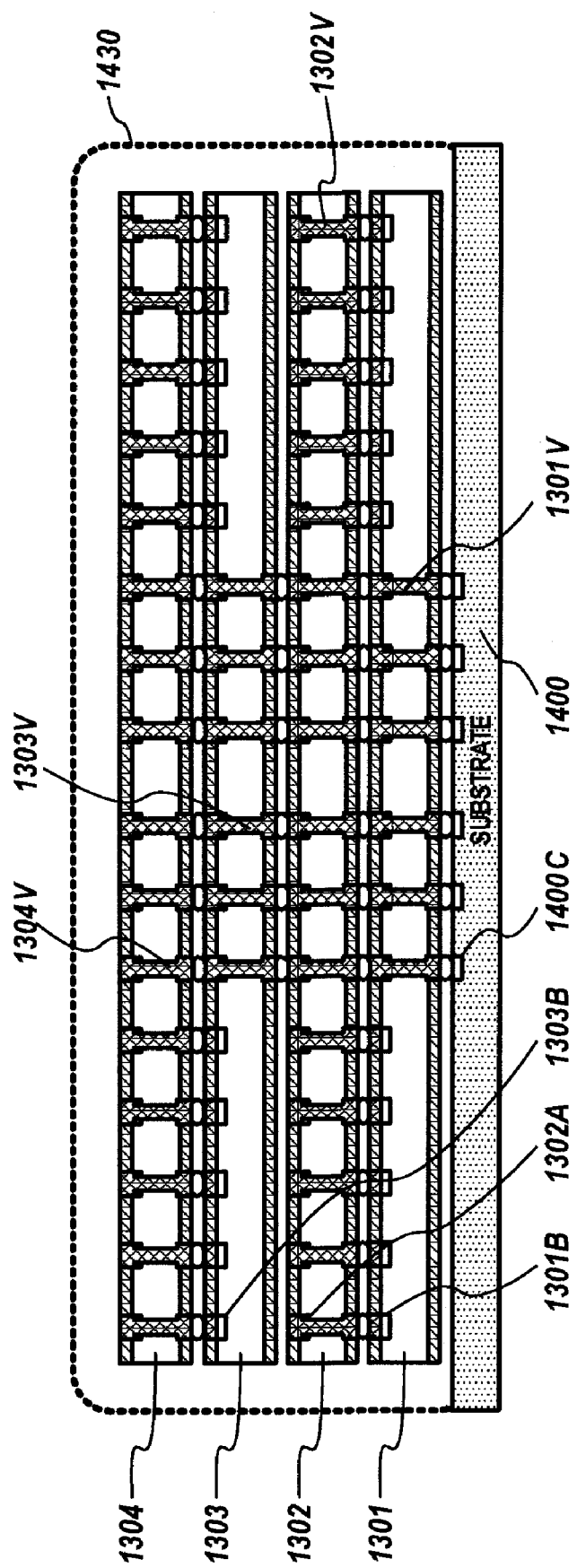

FIG. 14 is an example diagram illustrating multi-chip stacking using through-hole technology (through-silicon via) and surface pad connectivity according to embodiments herein. FIGS. 15 through 17 are diagrams illustrating cross sectional views corresponding to FIG. 14 along lines AA-AA, BB-BB and CC-CC, respectively.

As shown, the memory storage stack shown in FIG. 14 includes four chips, namely chips 1301, 1302, 1303 and 1304. The chips in the stack may have the same input/output configuration layout as discussed above in FIG. 13. The second chip 1302 and the fourth chip 1304 in the stack can be rotationally offset 180 degrees with respect to chip 1301 and chip 1303 in the stack.

According to the cross sectional views in FIGS. 15 through 17, all four chips may have pre-drilled or pre-etched vias (through-holes) and via-fillings for the specified TSV pads so that each chip can be bonded to each other in the chip stacking and bonding process.

The serial output pads 1304B of the fourth chip 1304 can be interconnected to the electrically conductive metallization bond areas 1400B on the substrate 1400 by using links 1412 such as, for example, bond wires. In other words, embodiments herein can include electrical connectivity between surface pads (such as, for example, outputs) on a plane of chip 1304 in the stack (or a last memory device in the stack) to inputs associated with a corresponding controller that controls operation of the memory storage stack.

The first chip 1301 has a plurality of TSVs 1301V (for example, through-hole connections) for the serial input pads 1304A and the common input pads 1304C on the left side the chip as shown in FIG. 15. Also, the illustrated chip 1301 has some conductive metallization landing pads 1301L on the serial output signals' wire-bond pads 1301B in order to compensate the height of the TSV 1301V.

In a similar manner as discussed above, the stack of chips 1301, 1302, 1303, and 1304 can be coupled to a controller. The coupling between the controller and the first chip 1301 in the stack enables the controller to convey data through the memory devices and thus store data in the memory devices. The coupling between the last memory device in the stack (chip 1304 in this example) back to the controller enables the controller to retrieve data stored in the respective memory devices. This latter embodiment includes unique connectivity between chips such as, for example, through-hole to surface pad connections.

Solder balls 1301S (for example, solder joints or other suitable conductive material) can be used to electrically connect the TSVs 1301V and conductive metallization bond areas 1400A on the substrate 1400.

Other solder balls 1302S-1304S (solder joints or other suitable conductive material) can be used to electrically connect the TSVs 1302V-1304V and the conductive metallization landing pads 1301L-1303L.

According to one embodiment, the top and bottom surface of the chips 1301-1304 are processed with additional insulation layers 1320 in order to protect the chips and to provide an even depth in between the landing pads 1301L, 1302L, 1303L, and 1304L and the TSVs 1301V, 1302V, 1303V, and 1304V. As will be appreciated by those skilled in the art, these protective layers are optional.

In between each illustrated chip, adhesive layers 1460 are used to attach the chips and form the stack.

In FIG. 15, the second chip 1302 and the fourth chip 1304 are rotated 180 degrees along the chip's horizontal so that both chips' TSVs 1302V and 1304V are aligned with the conductive metallization landing pads 1301L and 1303L, respectively. Also, the third chip's TSV 1303V may be aligned with respect to the conductive metallization landing pad 1302L.

Thus, as an alternative to staggering the successive memory devices in the stack for making connections as discussed above with respect to FIGS. 3 and 4, the memory devices such as chips 1301, 1302, 1303, and 1304 can be aligned in the stack such that outputs (for example, surface pads) located on a top facing of the chip 1301 are vertically aligned with respect to corresponding inputs (through-holes) located in chip 1302. As shown, a surface pad on a plane of one chip can be electrically connected to a through-hole of another chip by filling the through-hole with conductive material. The conductive material filling the through-hole and contacting the respective surface pad provides an electrical connection for creating paths through the respective stack as discussed above.

As discussed above, to align the surface pads (inputs) of chip 1301 with corresponding through-holes (outputs) of chip 1302, embodiments herein can include rotationally offsetting (by an amount such as, for example, around 180 degrees) chip 1302 relative to chip 1301 in the stack. The rotational offset can be performed with respect to a stacking axis such as, for example, the axis along which the memory devices are stacked on top of each other.

More specifically, each of the chips 1301, 1302, 1303, and 1304 in the stack can be planar-shaped and have a respective top facing and bottom facing. The first hip 1301 and a subsequent chip 1302 are stacked on top of each other in which a respective bottom facing of the chip 1302 is secured to a top facing of the chip 1301. The top facing of the chip 1301 and the top facing of the chip 1302 point in a same direction (for example, upwards) along the stack.

Based on proper alignment of the chips 1301, 1302, 1303, and 1304, outputs located on the top facing of the chip 1301 are vertically aligned in the stack over corresponding inputs of the chip 1302. In other words, the memory devices can be aligned such that surface pads (outputs) of one memory device in the stack align directly with through-holes (inputs) to a subsequent memory device in the stack. Stacking the memory devices directly on top each other reduces a length of the leads to enhance performance. As mentioned above, it also reduces an effective volume occupied by the stack.

Figure 18:
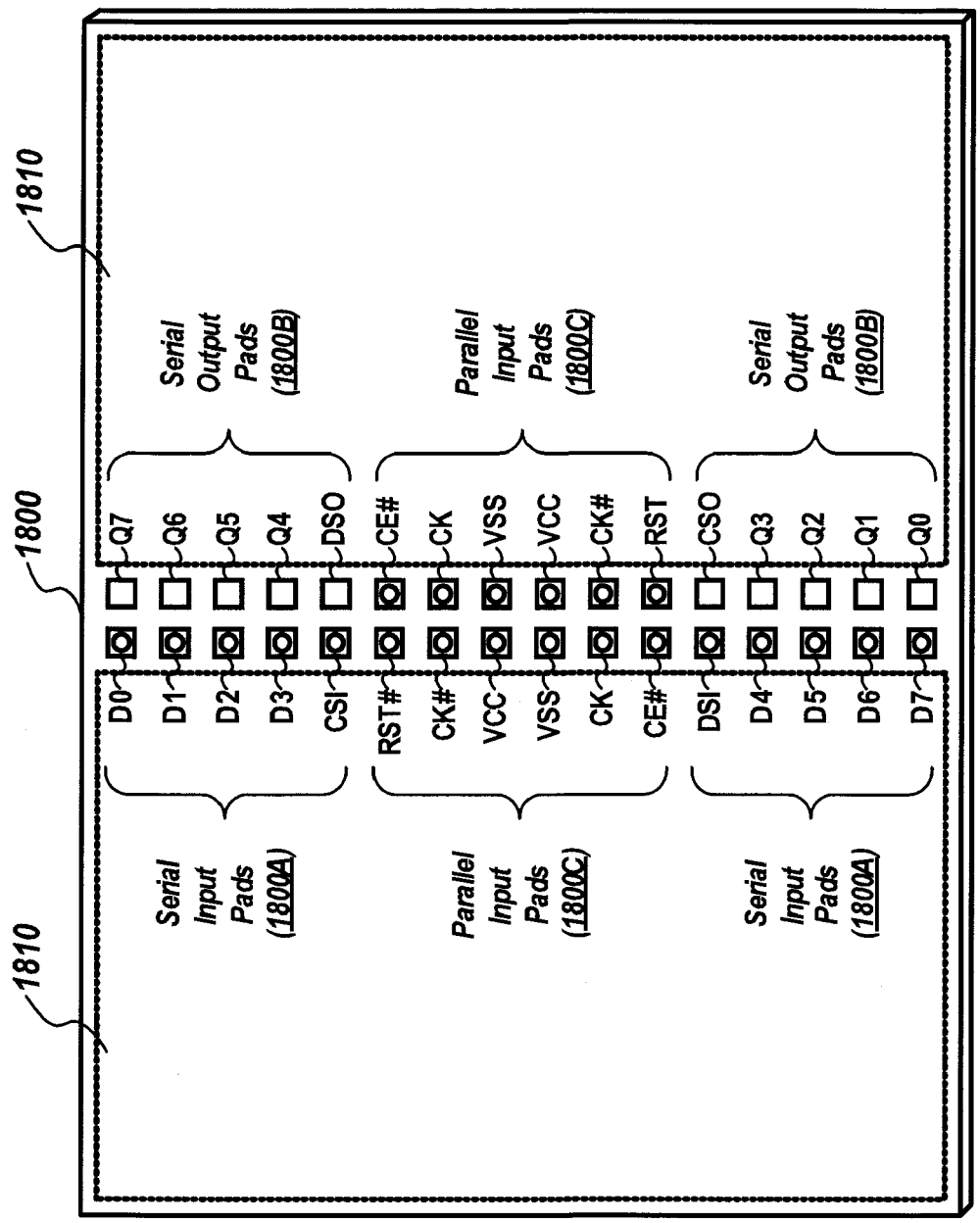
FIG. 18 is an example diagram illustrating a configuration layout of multiple inputs and multiple outputs according to embodiments herein.

FIG. 18 is a diagram of a TSV pad arrangement in accordance with an example embodiment, and with center located dual rows. In the illustrated example embodiment, two rows of pads are arranged in the middle of a chip 1800, and two memory cell-arrays 1810 and 1820 are located on both left and right sides of the pads area.

As was previously illustrated, it is noted that the order of the pads in each row is reversed for each other in order to accommodate every second chip's 180 degree rotated stacking technology in accordance with the example embodiment. In other words, the chip 1800 in FIG. 18 is similar to chip 1300 in FIG. 13. However, chip 1800 includes columns of inputs and outputs that are aligned closer to a center axis of the memory device rather than being disposed at opposite edges of the memory device.

Figure 19:
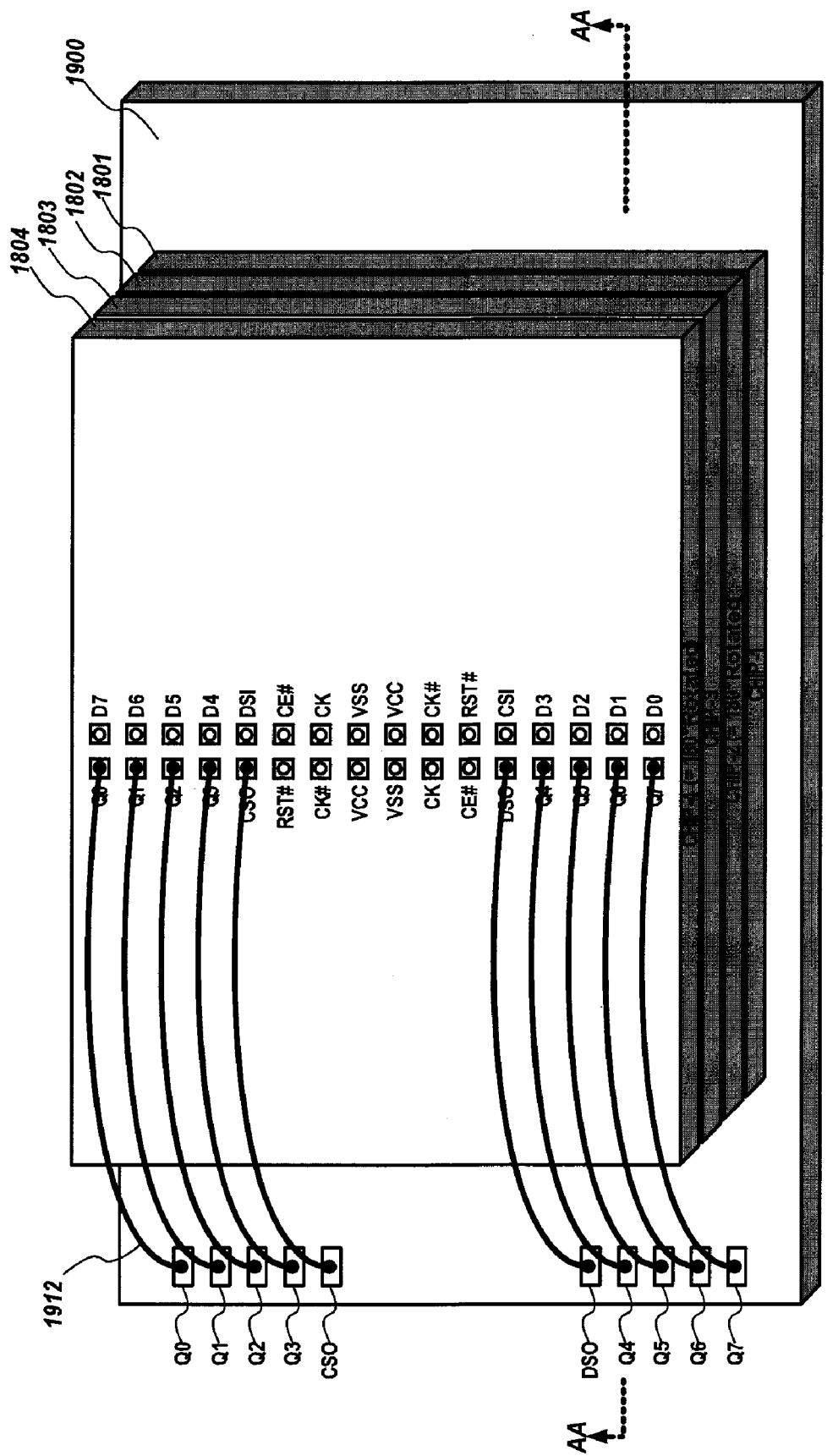
FIG. 19 is an example 3-dimensional diagram illustrating a stacking of memory devices and corresponding connectivity according to embodiments herein.

FIG. 19 is a diagram showing a similar way to stack four chips with through-hole and wire bonding interconnection technologies having the 180 degrees rotation for every second chip.

In this embodiment, it is noted that links 1912 such as, for example, bond wires are provided in order to connect the last serial output pads to the substrate's output signals. Note that a redistribution layer can be created on to of chip 1804 so that the output pads Q0, Q1, Q2, Q3, Q4, Q5, Q6, and Q7 are moved closer to corresponding pads on substrate, reducing a length of links 1912.

Figure 20:
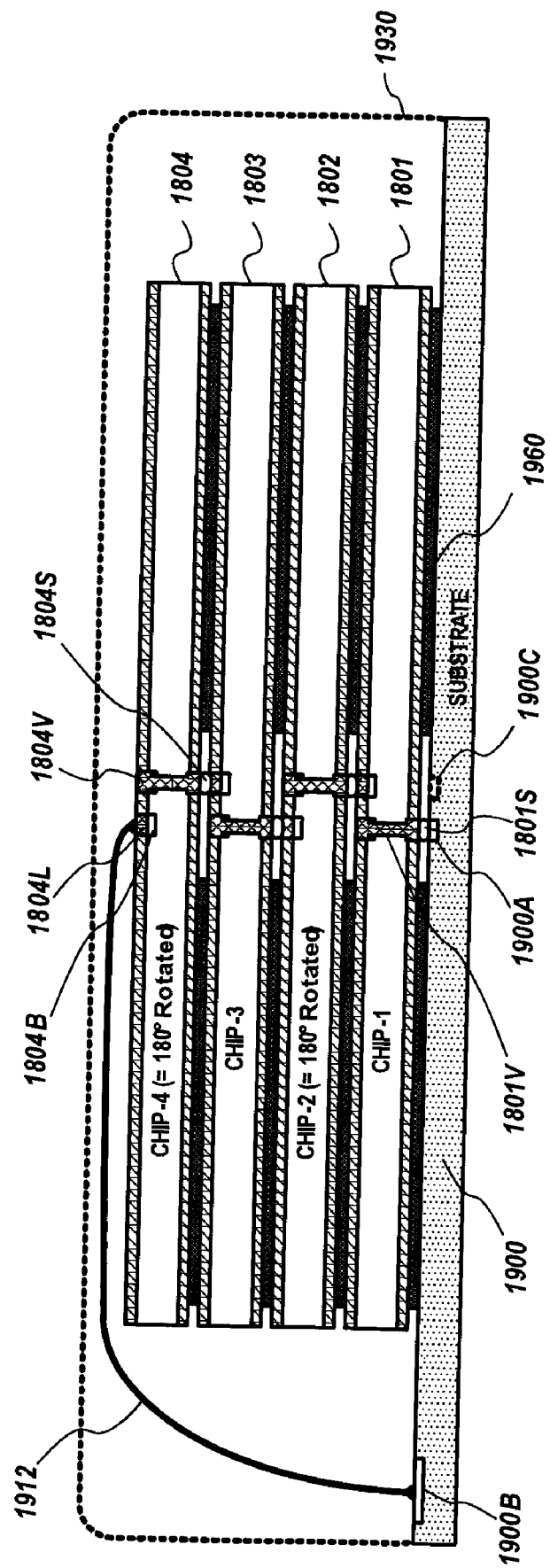
FIG. 20 is an example cross-sectional diagram illustrating connectivity in a layering of multiple memory devices according to embodiments herein.

FIG. 20 is an example diagram illustrating a cross section view of the memory stack of FIG. 19 using according to embodiments herein. As shown, the memory stack includes chips 1801, 1802, 1803, and 1804, each of which is configured as shown in FIG. 18. Every other chip in the stack is rotated 180 degrees in a manner similar to other embodiments herein.

Chip 1801 is secured to substrate 1900. Bond area represents an input signal from a source such as, for example, a controller. Solder joint couples input (bond area 1900A) to through-hole 1801V. Chip 1801 includes a circuit path between through-hole 1801V to an output pad of chip 1801. For each chip in the stack, the output pad at one layer is connected (via a solder joint (or other connective link) to a through-hole in a next successive chip in the stack. In this manner, the stack includes paths on which to pass data and control information through the chips.

At a top chip layer, solder joint 1804S connects the output surface pad of chip 1803 to the through-hole 1804V (input) to chip 1804. Chip 1804 includes a circuit path between through-hole 1804V and output pad 1804B. Link 1912 provides connectivity between band area 1900B of substrate 1900 and bond area 1804B via a connection to landing pad 1804L.

Figure 21:
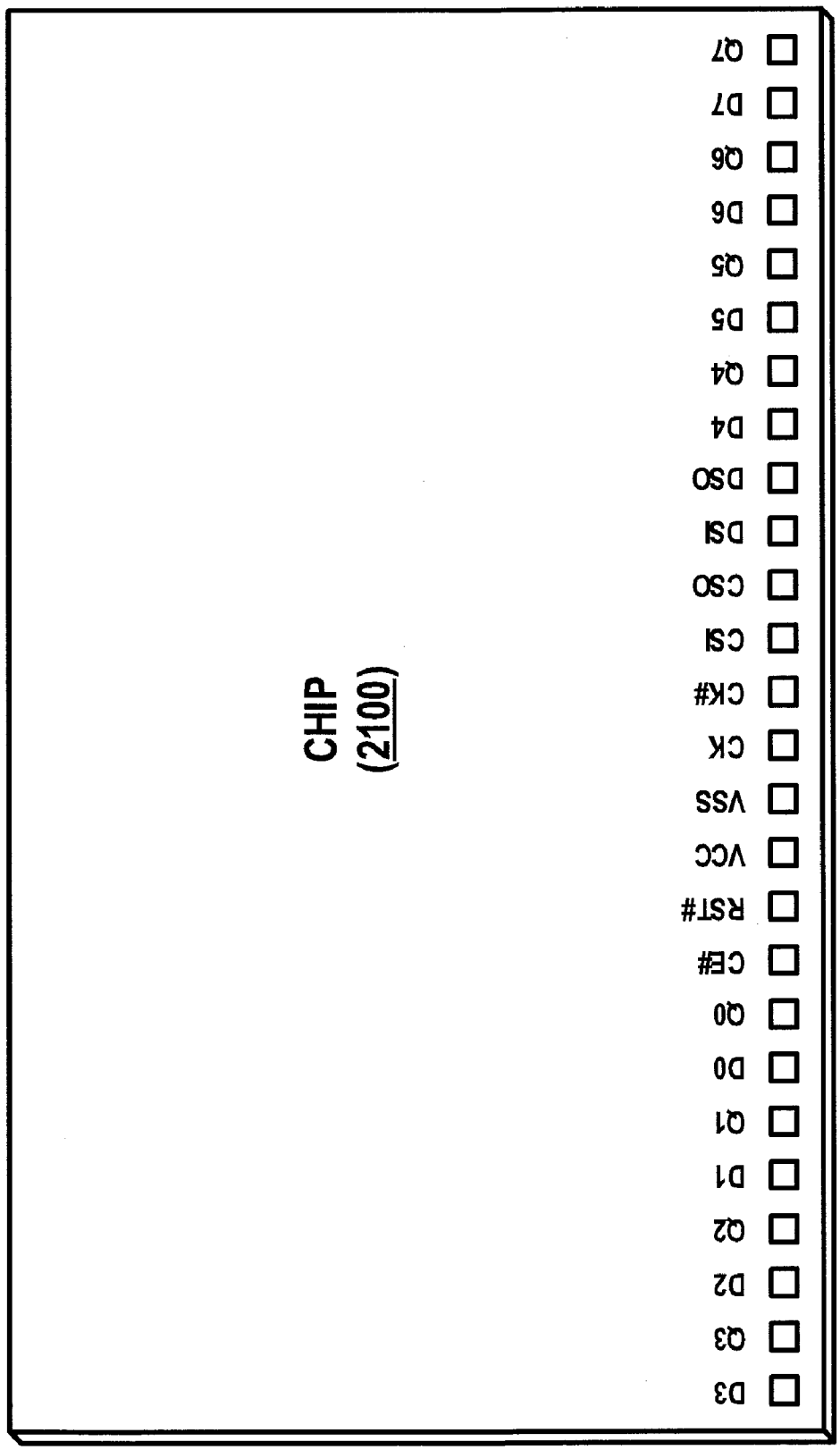
FIG. 21 is an example configuration layout of a stackable memory device according to embodiments herein.

FIG. 21 is a diagram of yet another bond pad arrangement of a chip according to embodiments herein.

Chip 2100 has a unique pad arrangement compared to previous example embodiments. In this pad arrangement, each corresponding serial input and output pad are placed substantially side-by-side in a column of inputs/outputs disposed on an edge of the chip 2100.

For example, serial input signal D3's corresponding pad and serial output signal Q3's pad are located substantially side by side in the ordering of the pads along an edge of chip 2100. Each other input/output pair is configured in a similar manner so that the input/output pair of pads is close to each other.

In other words, chip 2100 includes an ordering of inputs and outputs in which a given input and corresponding output are located next to each other in a corresponding column of inputs/outputs. More specifically, input D3 is located in the input/output column next to corresponding output Q3; input D2 is located in the input/output column next to corresponding output Q2; input D1 is located in the input/output column next to corresponding output Q1; input D0 is located in the input/output column next to corresponding output Q0; input CSI is located in the input/output column next to corresponding output CSO; input DSI is located in the input/output column next to corresponding output DSO; input D4 is located in the input/output column next to corresponding output Q4; input D5 is located in the input/output column next to corresponding output Q5 input D6 is located in the input/output column next to corresponding output Q6; and input D7 is located in the input/output column next to corresponding output Q7.

Figure 22:
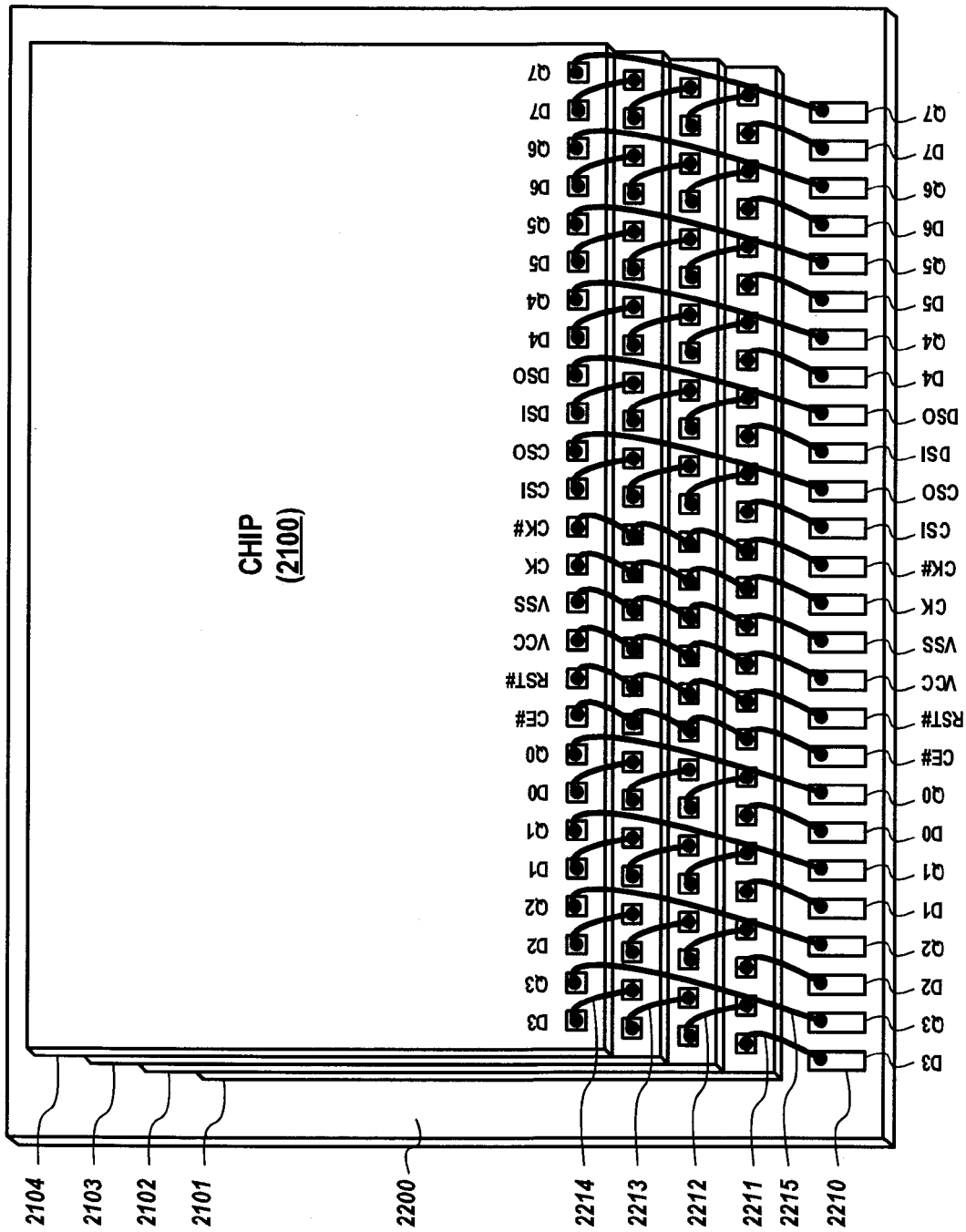
FIG. 22 is an example 3-dimensional diagram illustrating a stacking of multiple memory devices and corresponding connectivity according to embodiments herein.

As shown in the diagram of FIG. 22, this special pad arrangement in chip 2100 enables linking in a stack of respective chips. For example, chip stacking using chips 2100 can provide for efficient wire-bond interconnection between one chip layer and the next because of short bond wire lengths in between the serial input pad and the serial output pad.

Three-dimensional stacking methods applicable to serially interconnected multiple chips in a single package have been described. The chip-stacking methods may enable a memory subsystem or Solid State Disk (SSD) system containing a plurality of the chips to be implemented in a smaller area, which would allow the system/subsystem to occupy a smaller footprint or effective volume.

In accordance with some example embodiments, the memory chips are coupled in a serially interconnected arrangement, such that outputs of an earlier chip in the serial interconnection are coupled to inputs of the next chip later in the serial interconnection to accommodate the transfer of information (for example, data, address and command information) and control signals (for example, enable signals) from the earlier chip to the later chip.

In other words, each of the chips 2101, 2102, 2103, and 2104 has a same layout configuration as chip 2100 in FIG. 21. When stacked in a manner as shown in FIG. 22, the output of one chip can be easily connected to an input of a next successive chip in the stack because of the closeness of the input-output pairings on each chip as previously discussed.

Thus, embodiments herein include a first chip 2101 and second chip 2102 forming a memory storage stack. Both the first chip 2101 and second chip 2102 can have a same input/output layout configuration.

As shown in FIG. 22, each chip in the stack is offset (to produce a step) with respect to a next successive chip in the stack. Offsetting of each step can be in the same direction to produce a set of steps.

Offsetting of the chips as shown exposes outputs on a planar surface of lower chip in the stack (e.g., chip 2101) for electrically connecting to inputs on a planar surface of a next chip in the stack such as chip 2102. Connectivity between the outputs from one memory device to inputs of another memory device creates the paths as previously discussed. The connectivity between one memory device and another memory device in the memory storage stack can include a conductive link output pads of one chip layer to input pads of a next chip layer.

More specifically, a link 2211 such as, for example, a wire bond provides connectivity between pad 2210 of substrate 2200 and the input pad D3 of chip 2101; a link 2212 such as, for example, a wire bond provides connectivity between the output pad Q3 of chip 2101 and the input pad D3 of chip 2102; a link 2213 such as, for example, a wire bond provides connectivity between the output pad Q3 of chip 2102 and the input pad D3 of chip 2103; a link 2214 such as, for example, a wire bond provides connectivity between the output pad Q3 of chip 2103 and the input pad D3 of chip 2104; a link 2215 such as, for example, a wire bond provides connectivity between the output pad Q3 of chip 2104 back to pad Q3 on substrate 2200. Other paths through the stack are created in a similar manner as shown in FIG. 22.

The amount of offset between one chip and a next chip in the stack to produce a step can vary. However, in one embodiment, the offset is large enough so that the column (or columns) of input/outputs on an underlying chip are exposed to create links to the next chip. As shown in FIG. 22, the chips can be offset in the same direction relative to a stacking axis of the chips to produce a staircase of steps as mentioned above.

Figure 23:
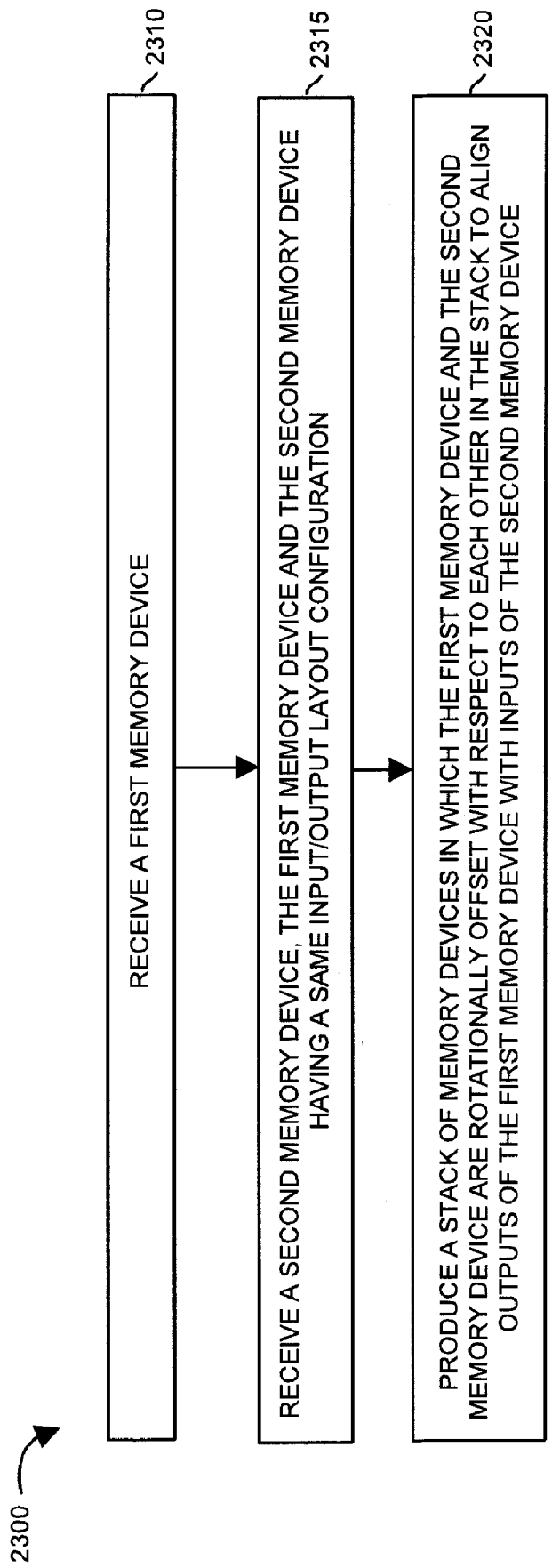
FIGS. 23-27 are example methods associated with fabrication of one or more memory devices and/or memory systems according to embodiments herein.

FIG. 23 is an example flowchart 2300 illustrating a method associated with creating a memory storage stack according to embodiments herein. In general, flowchart 2300 summarizes certain concepts as further discussed above such as, for example, the techniques describing creation of stacks in FIGS. 3-8 and 14-19. Note that an ordering of the steps in all of the flowcharts is by way of example only and that, in certain cases, steps may be performed in any suitable order. The term memory device refers to the chips as discussed above.

In step 2310, an assembler receives a first memory device.

In step 2315, the assembler receives a second memory device, the first memory device and the second memory device having a same input/output layout configuration.

In step 2320, the assembler produces a stack of memory devices in which the first memory device and the second memory device are rotationally offset with respect to each other in the stack to align outputs of the first memory device with inputs of the second memory device. In other words, the second memory device is oriented such that outputs of the first memory device are located in a vicinity of corresponding inputs of the second memory device.

Figure 24:
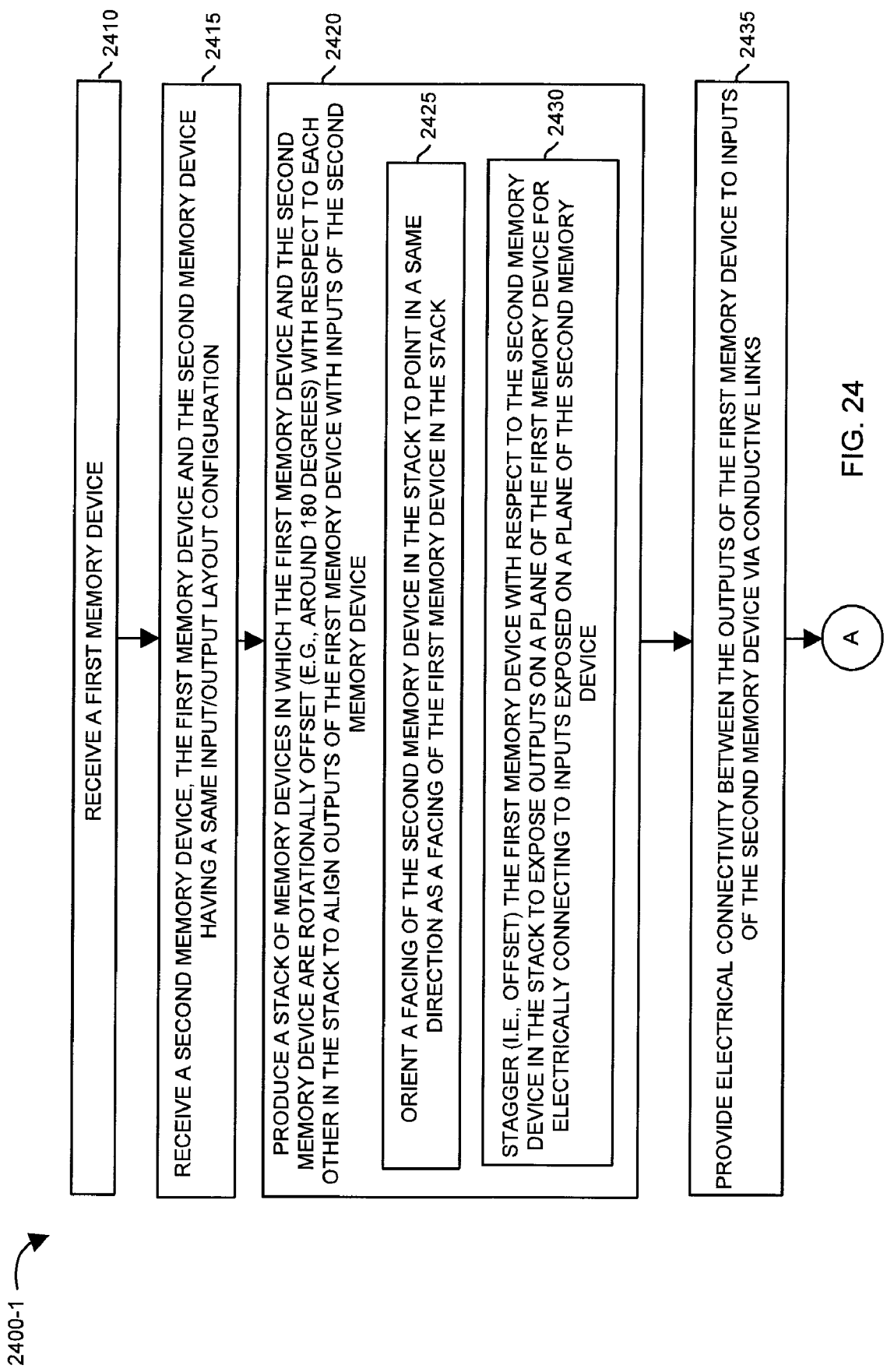
Figure 25:
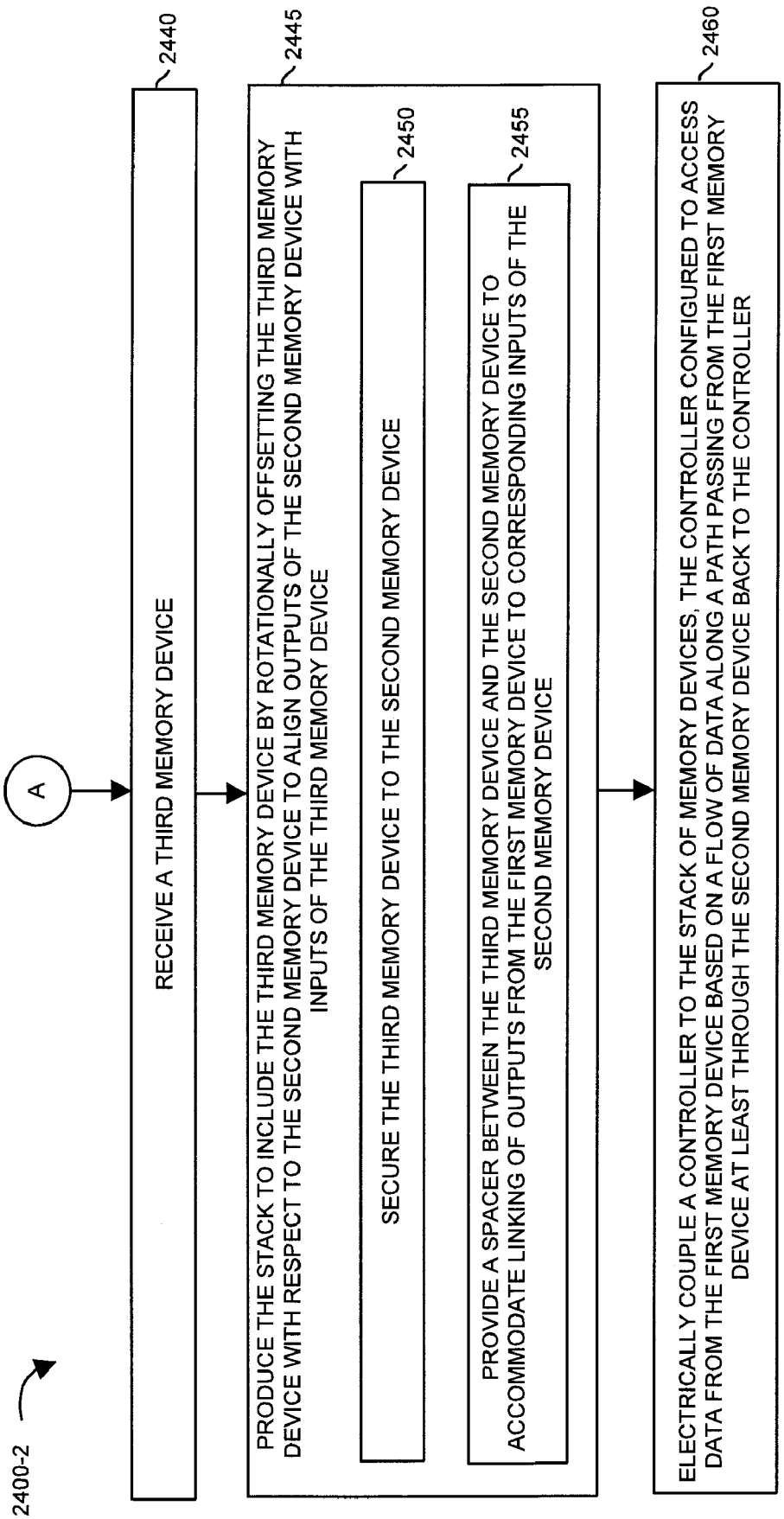

FIGS. 24 and 25 combine to form an example flowchart 2400 (e.g., flowchart 2400-1 and flowchart 2400-2) illustrating a method associated with creating a memory storage stack according to embodiments herein.

Flowchart 2400 captures certain concepts as further discussed above such as, for example, the techniques describing creation of stacks in FIGS. 3-8 and 14-19. However, note that sub-step 2430 and sub-step 2455 are not necessarily applicable to the creation of stacks in FIGS. 14-19 in which there is no lateral offset of one chip to the next chip on the stack. Also, note that an ordering of the steps in all of the flowcharts is by way of example only and that steps generally can be performed in any suitable order.

In step 2410, an assembler receives a first memory device.

In step 2415, the assembler receives a second memory device, the first memory device and the second memory device having a same input/output layout configuration.

In step 2420, the assembler produces a stack of memory devices in which the first memory device and the second memory device are rotationally offset (for example, around 180 degrees) with respect to each other in the stack to align outputs of the first memory device with inputs of the second memory device.

In sub-step 2425 associated with step 2420, the assembler orients a facing of the second memory device in the stack to point in a same direction as a facing of the first memory device in the stack.

In sub-step 2430, the assembler staggers (i.e., offsets) the first memory device with respect to the second memory device in the stack to expose outputs on a plane of the first memory device for electrically connecting to inputs exposed on a plane of the second memory device.

In step 2435, the assembler provides electrical connectivity between the outputs of the first memory device to inputs of the second memory device via conductive links.

In step 2440, the assembler receives a third memory device.

In step 2445, the assembler produces the stack to include the third memory device by rotationally offsetting the third memory device with respect to the second memory device to align outputs of the second memory device with inputs of the third memory device. Step 2445 includes sub-steps 2450 and 2455.

In sub-step 2450 associated with step 2445, the assembler secures the third memory device to the second memory device.

In sub-step 2455 associated with step 2445, the assembler provides a spacer between the third memory device and the second memory device to accommodate linking such as, for example, wire bonding of outputs from the first memory device to corresponding inputs of the second memory device.

In step 2460, the assembler electrically couples a controller to the stack of memory devices. As mentioned above, the controller can be configured to access data from the first memory device based on a flow of data along a path passing from the first memory device at least through the second memory device back to the controller.

Figure 26:
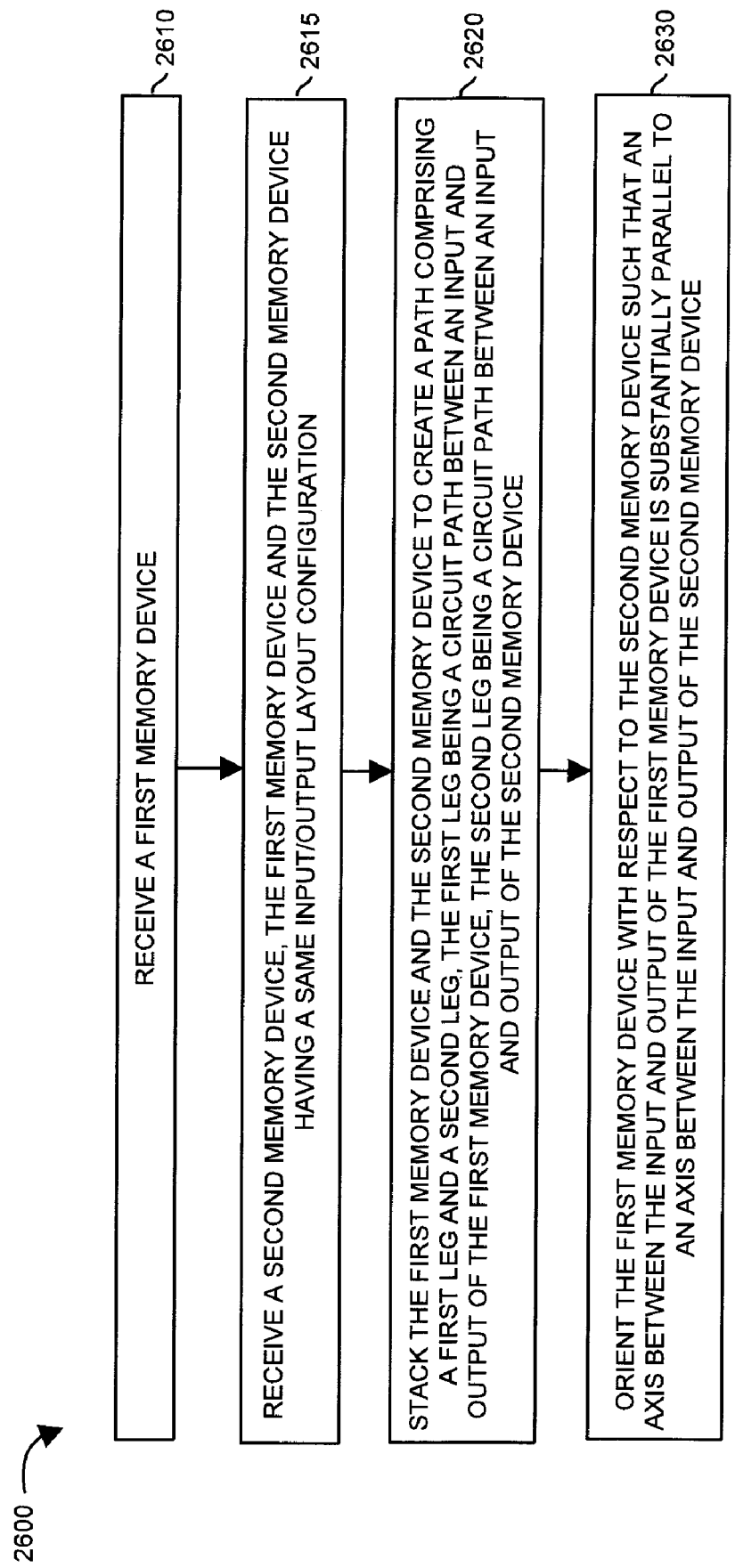

FIG. 26 is an example flowchart 2600 illustrating a method associated with creating a memory storage stack according to embodiments herein. Flowchart 2600 captures certain concepts as further discussed above such as, for example, the techniques describing creation of stacks in FIGS. 3-8 and 14-19.

In step 2610, an assembler receives a first memory device.

In step 2615, the assembler receives a second memory device, the first memory device and the second memory device having a same input/output layout configuration.

In step 2620, the assembler stacks the first memory device and the second memory device to create a path comprising a first leg (path segment) and a second leg (path segment). In an example embodiment, the first leg (path segment) is a circuit path between an input and output of the first memory device. The second leg (path segment) is a circuit path between an input and output of the second memory device.

In step 2630, the assembler orient the first memory device with respect to the second memory device such that an axis between the input and output of the first memory device is substantially parallel to an axis between the input and output of the second memory device.

Figure 27:
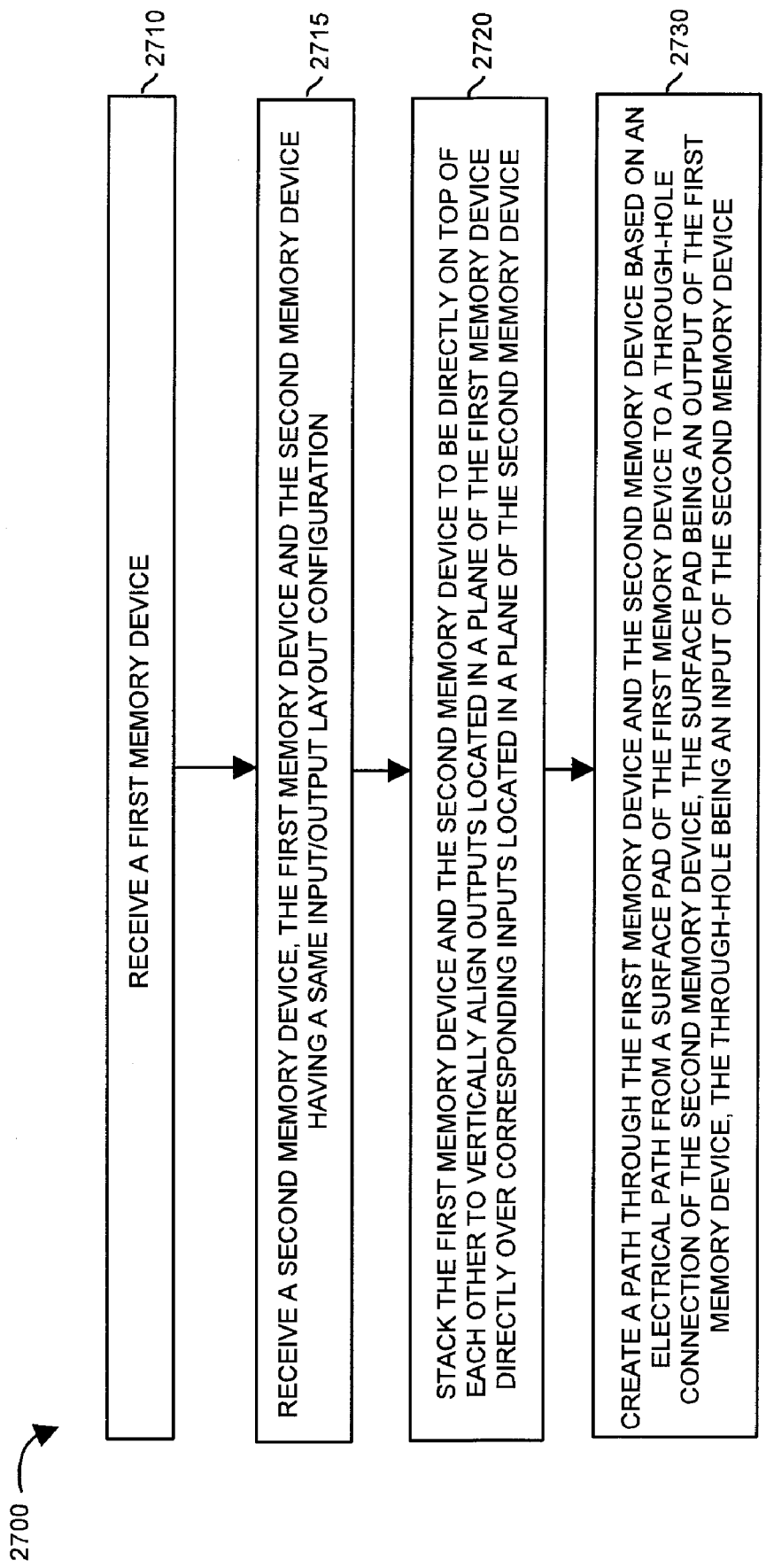

FIG. 27 is an example flowchart 2700 illustrating a method associated with creating a memory storage stack according to embodiments herein. Flowchart 2700 captures certain concepts as further discussed above such as, for example, the techniques describing creation of stacks in FIGS. 14-19.

In step 2710, the assembler receives a first memory device

In step 2715, the assembler receives a second memory device, the first memory device and the second memory device having a same input/output layout configuration.

In step 2720, the assembler stacks the first memory device and the second memory device to be directly on top of each other to vertically align outputs located in a plane of the first memory device directly over corresponding inputs located in a plane of the second memory device.

In step 2730, the assembler creates a path through the first memory device and the second memory device based on an electrical path from a surface pad of the first memory device to a through-hole connection of the second memory device. The surface pad on the first memory device is an output associated with the first memory device. The through-hole is an input of the second memory device.

Certain adaptations and modifications of the described embodiments can be made. Therefore, the above-discussed embodiments are considered to be illustrative and not restrictive.

What is claimed is:

1. A system comprising:
  a stack including:
    a first memory device;
    a second memory device having a same input/output layout configuration as the first memory device, the second memory device secured to the first memory device, and the second memory device in the stack being rotationally offset with respect to the first memory device in the stack, the rotational offset aligning outputs of the first memory device with corresponding inputs of the second memory device; and
    a path facilitating a series connection configuration between the first memory device and the second memory device, the path adapted to support conveyance of data.

2. The system as in claim 1, wherein the rotational offset of the first memory device with respect to the second memory device in the stack is substantially 180 degrees.

3. The system as in claim 1, wherein the stack includes a third memory device secured to the second memory device, the third memory device having a same input/output layout configuration as the first memory device and the second memory device; and
  wherein the third memory device in the stack is rotationally offset with respect to the second memory device in the stack, outputs of the second memory device aligned with corresponding inputs to the third memory device.

4. The system as in claim 3, wherein the path includes a series connection configuration through the first memory device, second memory device, and the third memory device for conveyance of the data.

5. The system as in claim 3, wherein the third memory device is staggered with respect to the second memory device in the stack to expose outputs on a plane of the second memory device for electrically connecting to inputs on a plane of the third memory device.

6. The system as in claim 1 further comprising:
  a controller electrically coupled to the first memory device, the controller accessing data from the first memory device based on a flow of data along the path from the first memory device through at least the second memory device to the controller.

7. A system comprising:
  a stack including:
    a first memory device;
    a second memory device having a same input/output layout configuration as the first memory device, the second memory device secured to the first memory device, and the second memory device in the stack being rotationally offset with respect to the first memory device in the stack to align outputs of the first memory device with corresponding inputs of the second memory device; and
    a path facilitating a series connection configuration between the first memory device and the second memory device, the path adapted to support conveyance of data;
    wherein the path comprises a first segment and a second segment, the first segment including a circuit path between an input and output of the first memory device, the second segment including a circuit path between an input and output of the second memory device; and wherein, based on the rotational offset of the second memory device with respect to the first memory device, an axis between the input and output of the first memory device is substantially parallel to an axis between the input and output of the second memory device.

8. The system as in claim 1, wherein the second memory device is staggered with respect to the first memory device in the stack to expose outputs on a plane of the first memory device for electrically connecting to inputs on a plane of the second memory device.

9. The system as in claim 8 further comprising:
links bridging the outputs on the plane of the first memory device to the inputs on the plane of the second memory device.

10. The system as in claim 1, wherein each of the first memory device and the second memory device are planar-shaped and have a respective top facing and bottom facing, the first memory device and second memory device stacked on top of each other in which a respective bottom facing of the second memory device is secured to a top facing of the first memory device such that the top facing of the first memory device and the top facing of the second memory device point in a same direction along the stack.

11. The system as in claim 10, wherein outputs located on the top facing of the first memory device are vertically aligned over corresponding inputs located on the top facing of the second memory device.

12. The system as in claim 11, wherein the input/output layout configuration includes input contacts and output contacts; and wherein the stack includes conductive links between output contacts of the first memory device and corresponding input contacts of the second memory device.

13. The system as in claim 1, wherein the inputs of the input/output layout configuration are through-hole connections and wherein the outputs of the input/output layout configuration are pads supporting surface connectivity.

14. The system as in claim 1 further comprising:
wherein the path includes a link between an output of the first memory device to an input of the second memory device, the output configured as a surface pad, the input configured as a through-hole connection, the link including conductive material between the surface pad and the through-hole connection.

15. The system as in claim 1, wherein each memory device in the stack is selectively set to a pass-through mode or a memory access mode;
the pass-through mode conveying data received at an input of a respective memory device along the path to an output of the respective memory device; and
the memory access mode i) receiving data on the path and storage of the data to memory circuitry associated with the respective memory device, and ii) retrieving data from the memory circuitry for transmission on the path to an output of the respective memory device.

16. The system as in claim 1, wherein the rotational offset of the second memory device with respect to the first memory device results in alignment of an output pad of the first memory device with an input pad of the second memory device, the output pad and the input pad forming part of the path.

17. The system as in claim 1, wherein the path includes a conductive link, the conductive link including a first end and a second end, the first end of the conductive link directly connected to a pad on the first memory device, the second end of the conductive link directly connected to a pad of the second memory device.

18. The system as in claim 1, wherein the stack includes an axis along which the second memory device is stacked on the first memory device; and
wherein the second memory device is rotationally offset about the axis with respect to the first memory device in the stack, the offset aligning the outputs of the first memory device with the corresponding inputs of the second memory device.

19. The system as in claim 18, wherein the second memory device is rotated substantially 180 degrees with respect to the first memory device in the stack.

20. The system as in claim 19, wherein the outputs reside on a surface of the first memory device and the corresponding inputs reside on a surface of the second memory device, the surface of the first memory device and the surface of the second memory device facing a same direction along the axis.

21. The system as in claim 20, wherein the second memory device is offset perpendicular with respect to the axis of the stack to expose the outputs on the first memory device for electrically connecting to the corresponding inputs of the second memory device.

22. The system as in claim 1, wherein each of the first memory device and the second memory device includes input-output pairings in which a respective input in the input/output layout configuration is diagonally paired with a respective output in the input/output layout configuration.

23. The system as in claim 22, wherein rotation of the second memory device in the stack with respect to the first memory device in the stack aligns an output of an input/output pairing of the first memory device to an input of an input/output pairing of the second memory device.

24. The system as in claim 23, wherein the input/output pairing of the first memory device and the input/output pairing of the second memory device correspond to a same input/output pairing layout in the input/output layout configuration.

25. The system as in claim 1, wherein the rotational offset of the second memory device with respect to the first memory device aligns an output of the first memory device with an input of the second memory device, the output and the input forming part of the path on which to convey the data; and
wherein the path includes a link coupling the input to the output, the link in the path conveying the data from the first memory device to the second memory device.

26. The system as in claim 1, wherein the input/output layout configuration includes input contacts and output contacts; and
wherein the stack includes conductive links between output contacts of the first memory device and corresponding input contacts of the second memory device.

27. The system as in claim 25 further comprising:
a controller that controls the conveyance of the data;
wherein the first memory device stores the data; and
wherein the controller initiates conveyance of the data from the first memory device to the second memory device over the path.

28. The system as in claim 1, wherein the stack includes an axis along which the second memory device is stacked on the first memory device; and
wherein the second memory device is rotationally offset about the axis with respect to the first memory device in the stack, the offset being substantially 180 degrees.

29. The system as in claim 7, wherein the first segment of the path diagonally traverses a plane of the first memory device from an input near a first edge of the first memory device to an output near a second edge of the first memory device; and
  wherein the second segment of the path diagonally traverses a plane of the second memory device from an input near a first edge of the second memory device to an output near a second edge of the second memory device.

30. The system as in claim 7, wherein a direction of data flow from the input to the output of the first memory device is substantially opposite to a direction of data flow from the input to the output of the second memory device.

* * * * *